(12) United States Patent
Lunsman et al.

(10) Patent No.: US 11,729,943 B2
(45) Date of Patent: Aug. 15, 2023

(54) RECEPTACLE WITH CONNECTABLE SPRING FINGER FOR MULTIPOINT CONTACT CONDUCTION COOLING

(71) Applicant: HEWLETT PACKARD ENTERPRISE DEVELOPMENT LP, Houston, TX (US)

(72) Inventors: Harvey J. Lunsman, Chippewa Falls, WI (US); Ernesto Ferrer, Aguadilla, PR (US); John Franz, Houston, TX (US)

(73) Assignee: Hewlett Packard Enterprise Patent Department LP, Spring, TX (US)

( * ) Notice: Subject to any disclaimer, the term of this patent is extended or adjusted under 35 U.S.C. 154(b) by 148 days.

(21) Appl. No.: 17/155,304

(22) Filed: Jan. 22, 2021

(65) Prior Publication Data
US 2022/0240416 A1     Jul. 28, 2022

(51) Int. Cl.
*H05K 7/20* (2006.01)

(52) U.S. Cl.
CPC ..... *H05K 7/20254* (2013.01); *H05K 7/20336* (2013.01)

(58) Field of Classification Search
CPC .......... H05K 7/20436; H05K 7/20418; H05K 7/20254; H05K 7/20336; H05K 7/20809; H05K 7/20218; H05K 7/2039; H05K 7/2049; H05K 9/0081; H05K 2201/10386; H05K 2201/09081
See application file for complete search history.

(56) References Cited

U.S. PATENT DOCUMENTS

| | | | | |
|---|---|---|---|---|
| 5,576,933 A | * | 11/1996 | Campanella | ........ H01L 23/4093 174/16.3 |
| 6,434,001 B1 | * | 8/2002 | Bhatia | ..................... G06F 1/203 361/679.48 |
| 8,303,332 B2 | | 11/2012 | Wertz | |
| 8,593,813 B2 | | 11/2013 | Wertz | |
| 9,185,828 B2 | | 11/2015 | Knudsen et al. | |
| 9,845,999 B2 | | 12/2017 | Matsushima et al. | |
| 10,667,431 B1 | | 5/2020 | Lunsman et al. | |
| 2005/0202727 A1 | * | 9/2005 | Andre | .................... H01R 13/26 439/660 |

(Continued)

*Primary Examiner* — Adam B Dravininkas
(74) *Attorney, Agent, or Firm* — Hewlett Packard Enterprise Patent Department

(57) ABSTRACT

Example implementations relate to an electronic system providing thermal management of a removable device when connected to a host device of the electronic system including a receptacle, and a heat transfer device having first and second portions. The host device has a cooling component. The removable device having a heat spreader, is detachably coupled to the host device. The receptacle having spring fingers, is coupled to one of the cooling component or the heat spreader. The first portion is coupled to one of the cooling component or the heat spreader, and the second portion is protruded outwards. When the removable device is connected to the host device, the second portion extends through the receptacle such that the spring fingers establish direct thermal interface with the second portion to allow waste-heat to transfer between the heat transfer device and one of the cooling component or the heat spreader via the receptacle.

21 Claims, 10 Drawing Sheets

(56) References Cited

U.S. PATENT DOCUMENTS

| | | | |
|---|---|---|---|
| 2015/0201533 A1* | 7/2015 | Daughtry, Jr. | H05K 9/0032 29/840 |
| 2016/0106001 A1* | 4/2016 | Wanha | G06F 1/183 165/80.4 |
| 2019/0200485 A1* | 6/2019 | Coteus | H01L 23/367 |

* cited by examiner

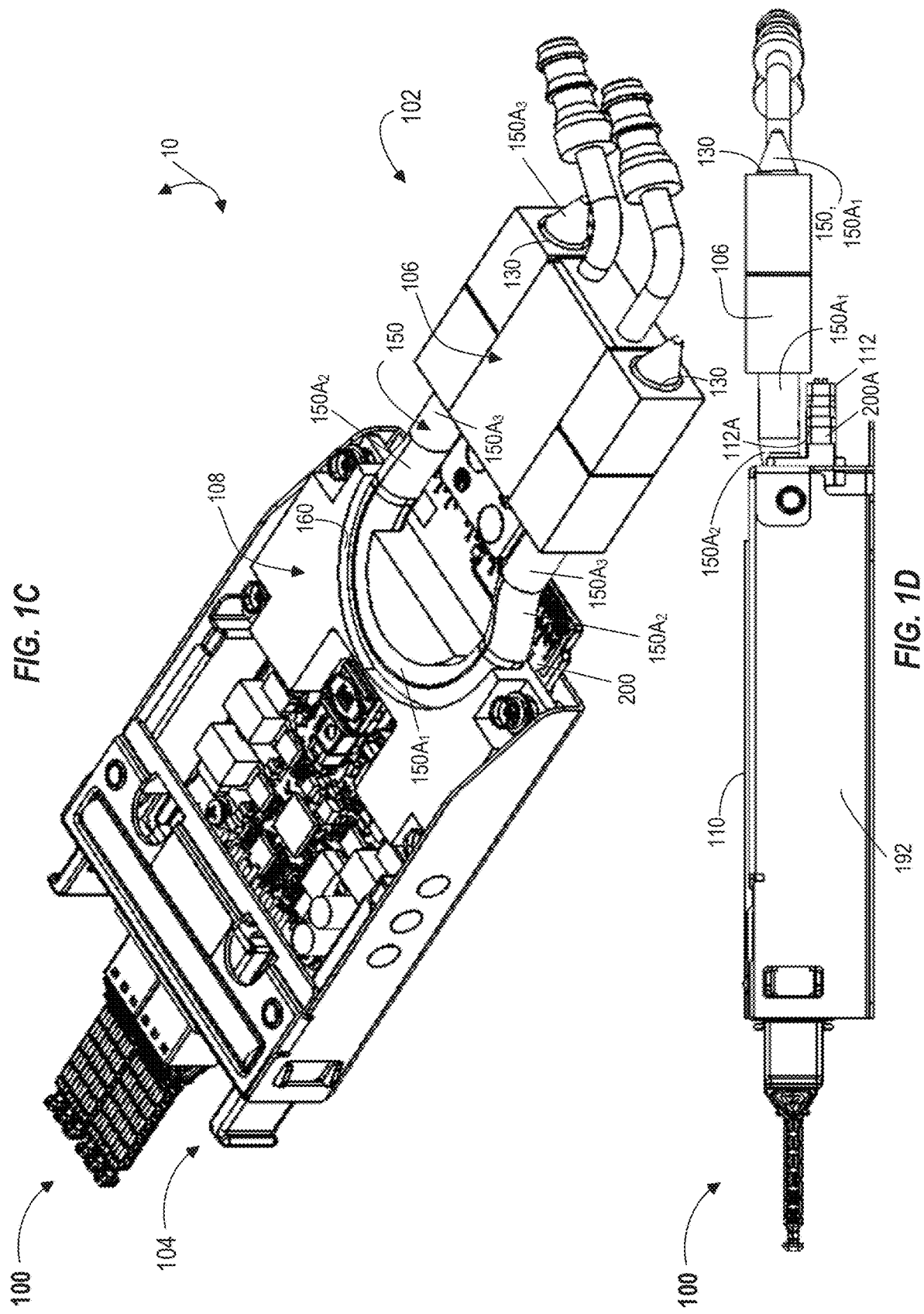

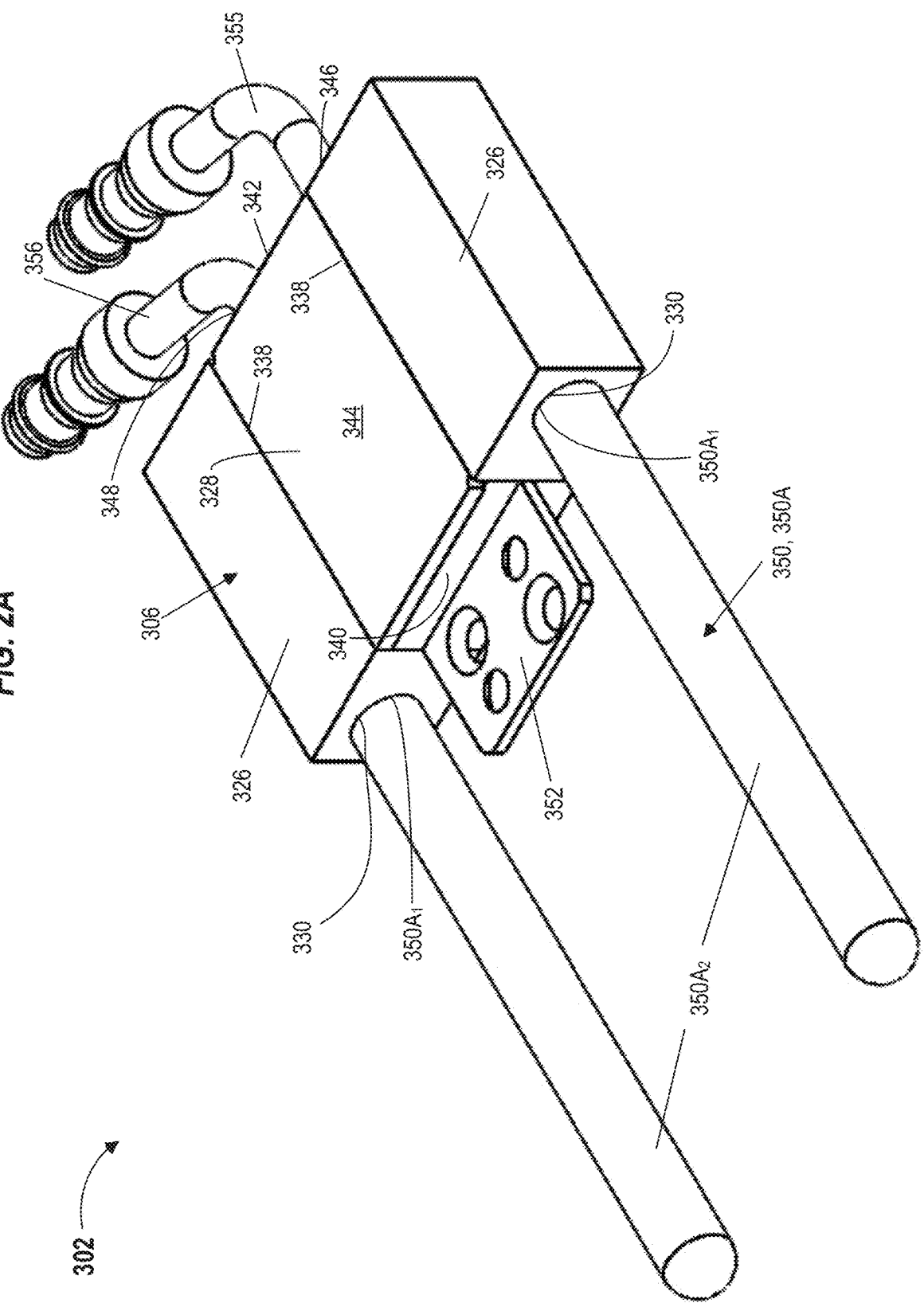

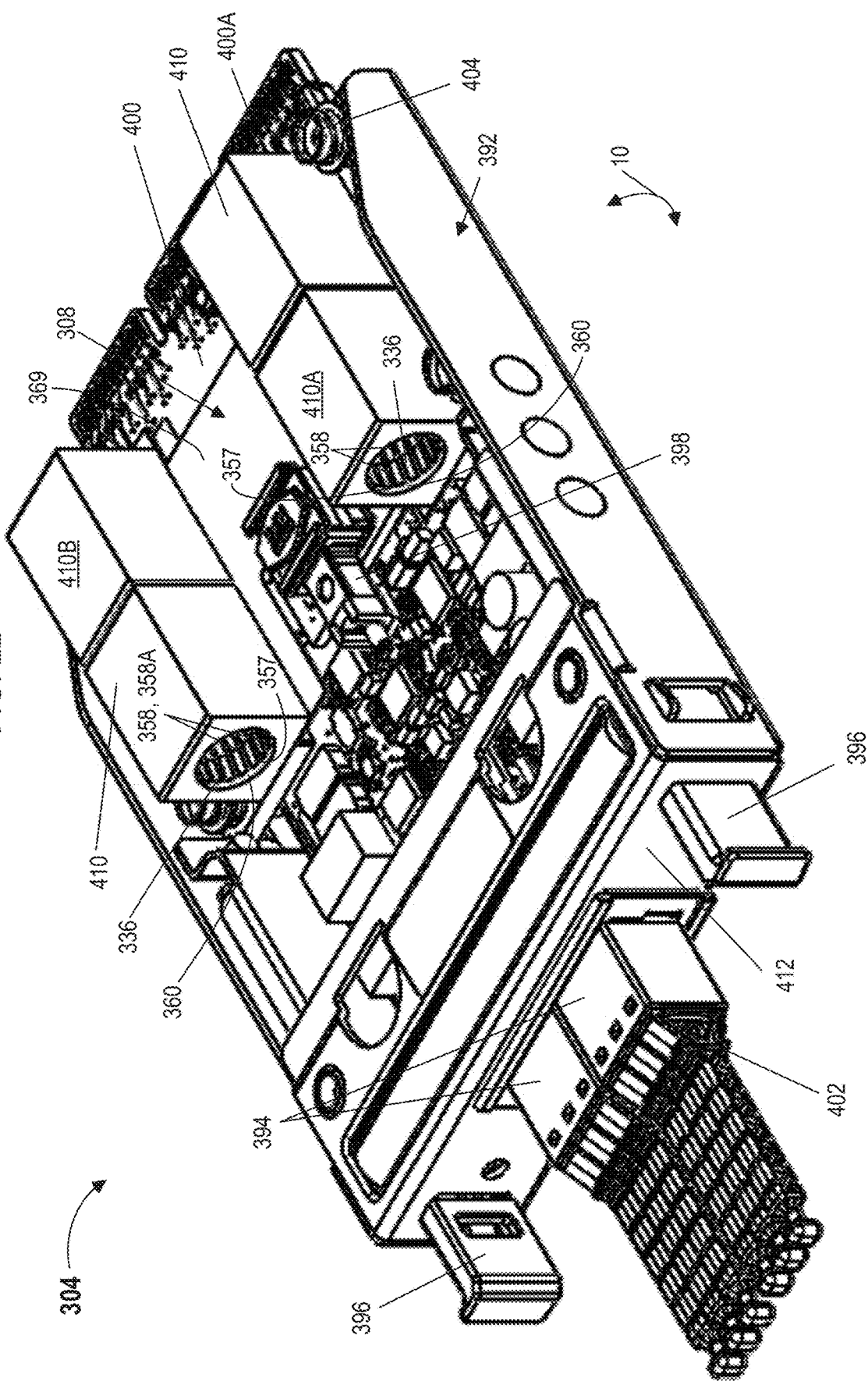

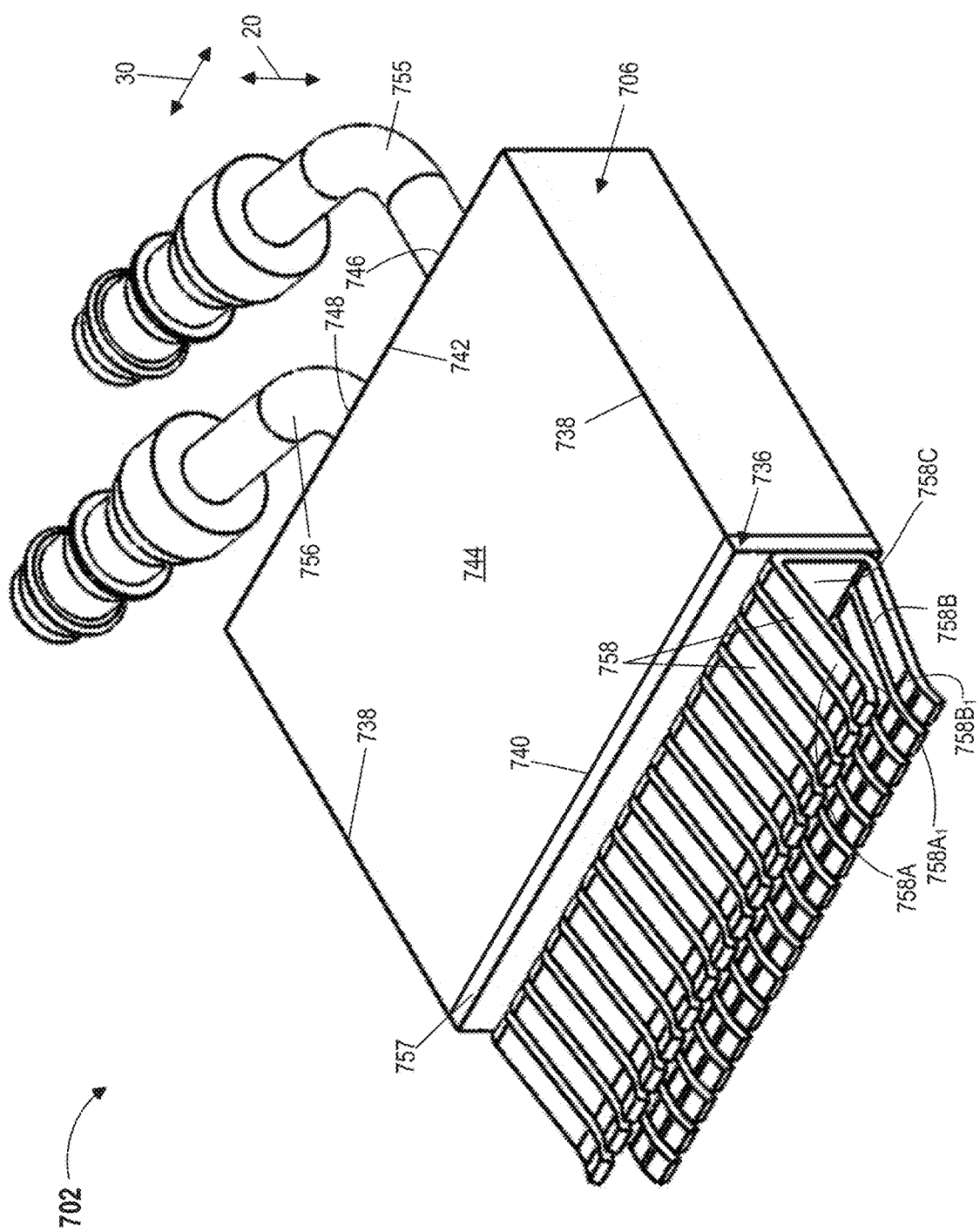

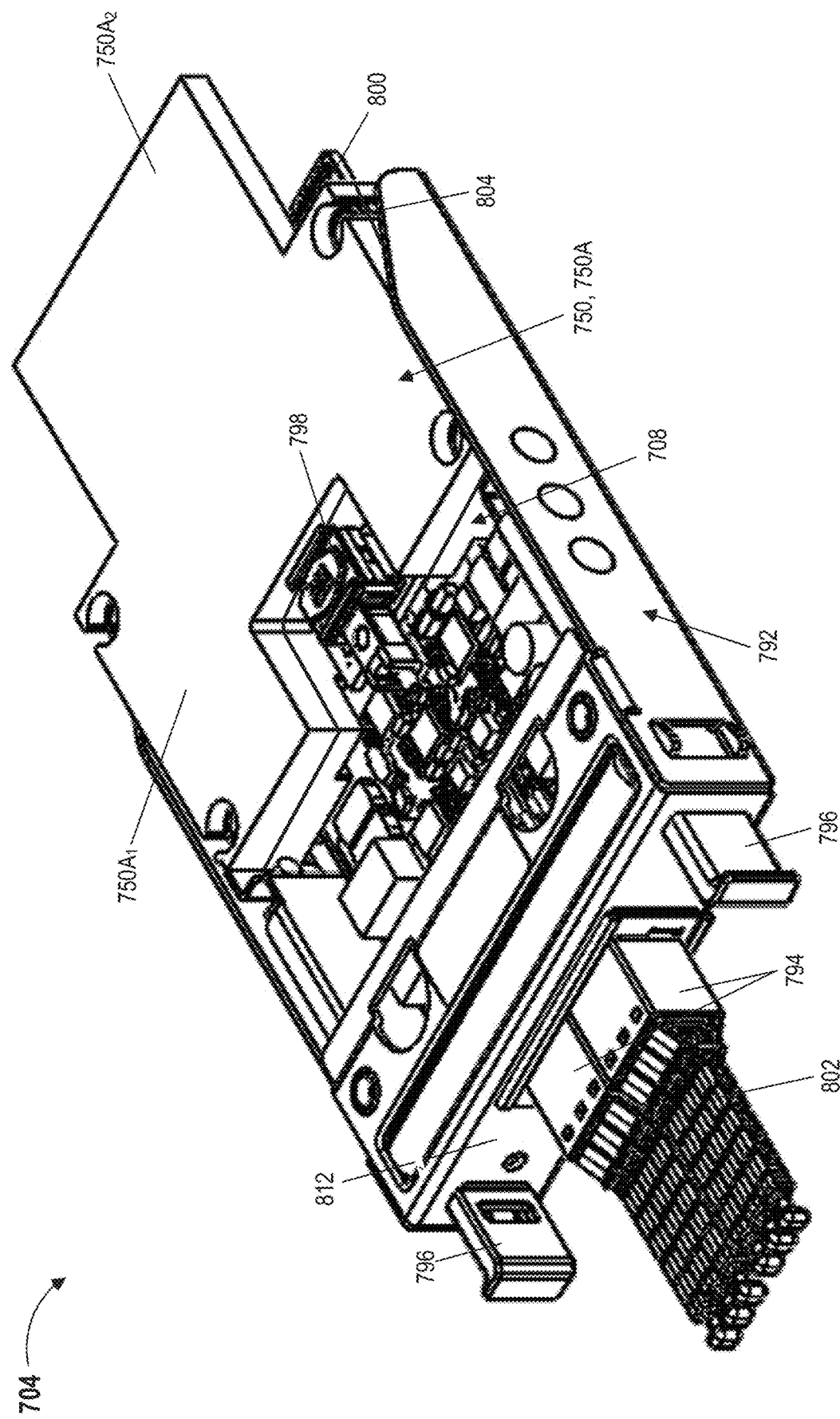

RECEPTACLE WITH CONNECTABLE SPRING FINGER FOR MULTIPOINT CONTACT CONDUCTION COOLING

BACKGROUND

A removable device, such as a small form-factor pluggable (SFP) transceiver device or a non-volatile memory express (NVMe) storage drive may consume a greater amount of power, while performing its respective functions, such as transmitting data, receiving data, processing data, storing data, or the like. Thus, the removable device may generate excessive waste-heat, while performing its respective functions. If the adequate amount of the waste-heat is not dissipated from the removable device, it may exceed thermal specifications of the removable device, and thereby degrade the performance, reliability, life expectancy of the removable device, and may also cause its failure. Accordingly, one or more heat sinks may be used to regulate the waste-heat in the removable device.

BRIEF DESCRIPTION OF THE DRAWINGS

Various examples will be described below with reference to the following figures.

FIG. 1C illustrates a perspective view of an electronic system having the removable device of FIG. 1B detachably connected to the host device of FIG. 1A according to an example implementation of the present disclosure.

FIG. 1D illustrates a side view of an electronic system according to an example implementation of the present disclosure.

FIG. 2A illustrates a perspective view of a cooling component of a host device according to another example implementation of the present disclosure.

FIG. 2B illustrates perspective view of a removable device having a heat spreader according to another example implementation of the present disclosure.

FIG. 4A illustrates a perspective view of a portion of a host device having a cooling component according to yet another example implementation of the present disclosure.

FIG. 4B illustrates a perspective view of a removable device having a heat spreader according to yet another example implementation of the present disclosure.

DETAILED DESCRIPTION

Figure 1A:
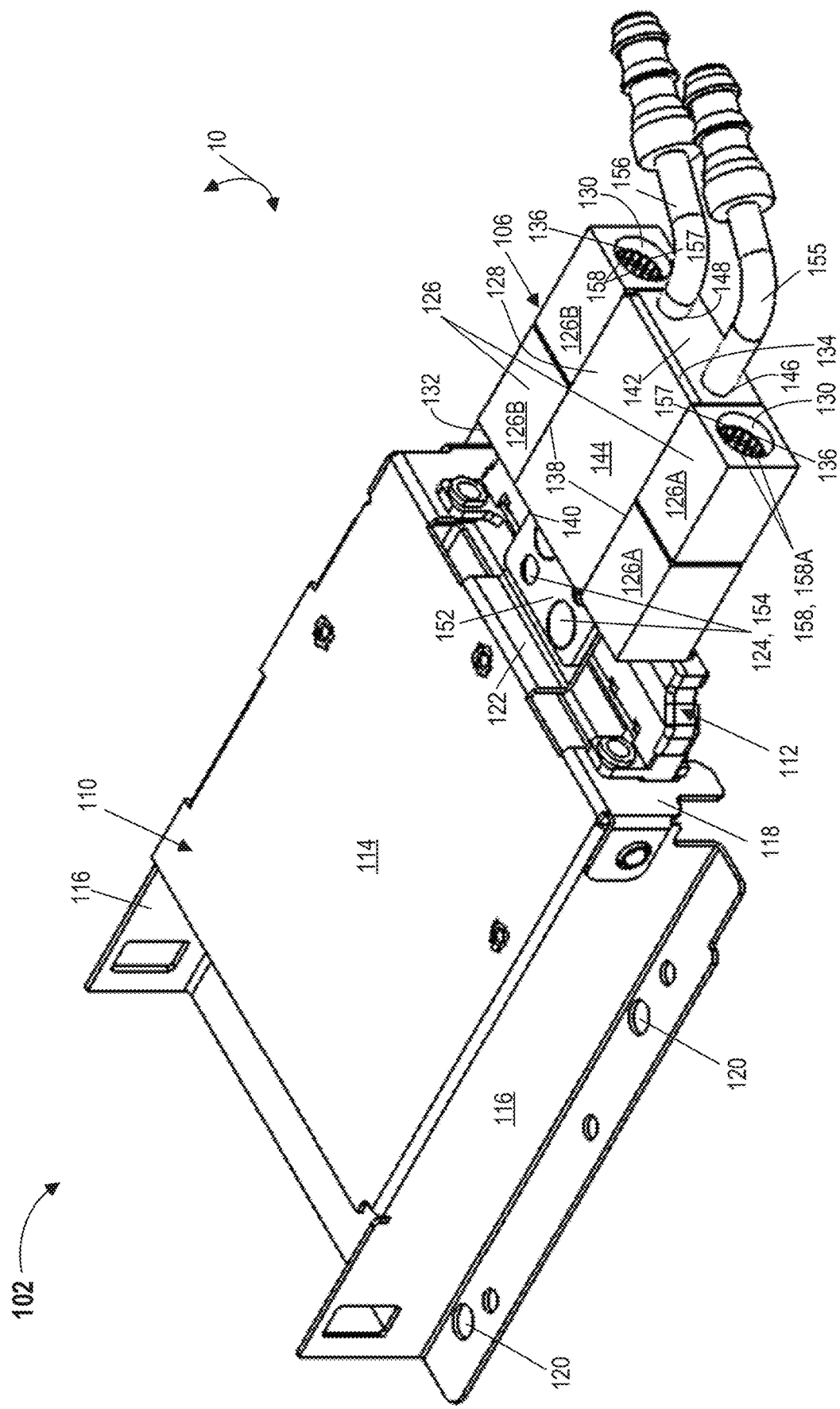
FIG. 1A illustrates a perspective view of a host device having a cooling component according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

As used herein, the term "host device" may refer to a type of a computing device, such as a server device, a storage device, a power conversion device, or a networking device, having a connector or a modular port for receiving a removable device. As used herein, the term "removable device" may refer to a type of a connectable electronic device, which is not native to the host device, or which is ancillary to the host device, and may have to be connected by way of plugging into the modular port of the host device for transmitting, receiving, storing, or processing data. For example, the removable device may be a pluggable transceiver device or a pluggable storage drive, or the like. The term "modular port" may refer to a type of electronic connector, which is native to the host device, or which is integral to the host device, and may provision the removable device to be detachably connectable to the host device. As used herein, the term "electronic system" may refer to a type of a compute infrastructure, for example, a rack or an enclosure, where the removable device and the host device may function as a plug and a socket of the compute infrastructure. Further, the term "connectable" may refer to fitting or plugging of the removable device into the modular port of the host device by way of inserting or sliding of the removable device into the modular port/socket of the host device. Further, as used herein, the term "thermal interface" may refer to surfaces of two components, which are in direct contact or indirect contact with one another to establish the thermal communication there between, so as to allow a waste-heat to transfer between those two components. As used herein, the term "direct thermal interface" may refer to surfaces of two components, which are in direct contact with one another to form the interface there between, and to allow the waste-heat transfer directly between the two components. For example, the direct thermal interface may be formed by the direct contact of a dry contact surface of each spring finger with a portion of the heat transfer device, in which there is no intermediary component (i.e., gap pad, grease, foam, or the like) in-between those two surfaces. The term "dry contact surface" may refer to a surface area of each spring finger, which is configured to contact a mutually opposite surface or portion (mating surface or portion) of another component, for example, the portion of the peripheral surface of the heat transfer device to directly transfer the waste-heat there between, without the presence of an intervening component. As used herein the term "cold plate" may refer to a type of a thermally conductive component, which may contain an internal tubing through which a liquid coolant is forced to flow, so as to absorb the waste-heat transferred to the cooling component by a waste-heat producing component, for example, a circuit board of a removable device, or one or more electronic components mounted on the circuit board. In some examples, the cold plate may also be referred to as a liquid-cooled dissipater. Further, the term "heat sink" may refer to a type of a passive heat exchanger that may transfer the waste-heat generated by the waste-heat producing component to a fluid medium, such as an air or a liquid coolant flowing over the heat sink. It may be noted herein: an object, device, or assembly (which may comprise multiple distinct bodies that are thermally coupled, and may include multiple different materials), is in "thermal communication" or is "thermally conductive" between two surfaces (that form the interface), if any one of the following is true: (i) a temperature difference between the two surfaces results in heat flux through the interface, (ii) the object is continuous piece of a material that has a thermal conductivity (often denoted k, λ, or κ) between the interface of about 200 W/mK to about 5000 W/mK, or (iii) the object is a heat pipe, vapor chamber, continuous body of copper, or continuous body of aluminum. Examples of materials whose thermal conductivity is between aforementioned ranges include certain types of copper, aluminum, silver, and gold, for example.

The present disclosure describes example implementations of an electronic system providing a thermal management of a removable device when connected to a host device of the electronic system. In accordance to one or more examples of the present disclosure, the electronic system may include the host device, the removable device, a receptacle, and a heat transfer device. In such examples, the host device may include a cooling component and the removable device may include a heat spreader. The receptacle may include a plurality of spring fingers, coupled to one of the cooling component or the heat spreader. The heat transfer device includes a first portion and a second portion. A first portion of the heat transfer device is coupled to one of the cooling component or the heat spreader, and a second portion of the heat transfer device is protruded outwards relative to one of the cooling component or the heat spreader. In such examples, when the removable device is connected to the host device, the second portion of the heat transfer device extends through the receptacle such that the plurality of spring fingers establish a direct thermal interface with the second portion to allow a waste-heat to transfer between the heat transfer device and one of the cooling component or the heat spreader via the receptacle.

For purposes of explanation, certain examples are described with reference to the components illustrated in FIGS. 1-5. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIG. 5 is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

A removable device, for example, a communication device or a storage drive may be a compact and a hot-pluggable electronic device/drive used for transferring, receiving, processing, or storing data. In some examples, the communication device, for example, a small form-factor pluggable (SFP) transceiver when connected to a host device, such as a networking device may function as an intermediary component between a networking device connector, such as a switch, a router, a firewall, or a network card (or NIC) of the network device, and an interconnecting cable, such as a copper cable or an optical fiber that is coupled to the transceiver. Typically, in such examples, the transceiver converts electrical signals into optical signals or vice versa for transmitting or receiving data through the interconnecting cable. Accordingly, the transceiver may consume a greater amount of power to convert the signals, and may thereby produce excessive waste-heat. In some other examples, the storage device, for example, a non-volatile memory express (NVMe) storage drive when connected to the host device, such as the storage device may function as the intermediary component between a peripheral-component interconnect express (PCIe) connector of the storage device and a cable connecting the NVMe storage drive. Typically, in such examples, the NVMe storage drive may process, store, and transfer data through the cable. Accordingly, the NVMe storage drive may consume a greater amount of power to process, store, and transfer the data, and may thereby produce excessive waste-heat.

In such examples, if the excessive waste-heat produced by the removable device is not adequately dissipated, it may degrade the removable device's performance, reliability, life expectancy and may also cause its failure. Accordingly, a heat spreader is disposed in thermal communication with the removable device so as to dissipate the waste-heat from the removable device. In such examples, a cooling air passing over the heat spreader is used to remove the waste-heat from the heat spreader. However, when the removable device is connected to the host device, the heat spreader may not receive adequate supply of the cooling air to remove the waste-heat from the heat spreader. Accordingly, the host device may provide a cooling component to remove the waste-heat from the heat spreader. In some examples, the cooling component may establish a thermal interface (or thermal contact) with the heat spreader to transfer the waste-heat from the heat spreader to the cooling component for removing the waste-heat from the heat spreader. However, maintaining the thermal contact between the cooling component and the heat spreader may be difficult, as interfacing surfaces of the cooling component and the heat spreader may not be flat and/or smooth. Also, the accumulation of debris and/or surface imperfections (i.e., scratches, dents, or the like) may compromise the heat transfer between the interfacing surfaces. Further, it may be difficult to generate an optimal contact force/pressure to maintain the thermal contact or thermal interface between the interfacing surfaces. In some other examples, the cooling component and the heat spreader may establish and maintain the thermal interface there between via an intermediate component in order to remove the waste-heat from the heat spreader. However, interfacing components (i.e., the intermediate component and one of the heat spreader or the cooling component) may also have surface imperfections or may not have smooth surfaces.

Therefore, in order to address the aforementioned issues, a TIM, such as thermally conductive gap pads or thermal greases may be disposed in-between the interfacing components. However, repetitive plugging/unplugging of the removable device into the host device may result in peeling of the gap pads or may degrade the gap pads over a period of time. Similarly, repetitive plugging/unplugging of the removable device into the host device may make the thermal grease messy, easily scraped off from the host device, when the removable device is glided (slided) into the host device, or have to be replaced after every service event. Further, when the TIM is disposed between the interfacing components, the electronic system may need to apply a force (i.e., load) to establish and maintain the thermal interface between the interfacing components via the TIM. In other words, the load may have to be optimal (i.e., limited or restricted) on the interfacing components in order to establish and maintain the thermal communication between the interfacing components via the TIM. However, if the load gets transferred from the interfacing components to any other components of the removable device, it may damage those components. For example, the removable device discussed hereinabove may comprise an open device structure, e.g., a circuit board and/or one or more electronic components mounted on the circuit card and directly exposed to an outside environment, and may get damaged due to the load transferred from the interfacing components. In other words, since the one or more electronic components, such as a processing resource mounted on the circuit board, and/or a ball grid array (BGA) used for mounting the processing resource to the circuit board, are pressure sensitive components, they may crumble due to the load transferred from the interfacing components.

Further, during connecting and disconnecting the removable device to the host device, the cooling component of the host device or the heat spreader of the removable device may exert a resistive force opposing an insertion force applied to connect the removable device to the host device or a withdrawal force applied to disconnect the removable device from the host device. In such examples, maintaining an optimal resistive force, which is within acceptable safety limits to avoid repetitive force (e.g., insertion force or withdrawal force) related injuries are extremely difficult.

A technical solution to the aforementioned problems may include providing an electronic system for a thermal management of a removable device when connected to a host device of the electronic system. In one or more examples, the electronic system may include the host device, the removable device, a receptacle, and a heat transfer device. The host device may include a cooling component and the removable device may include a heat spreader. The receptacle may include a plurality of spring fingers, coupled to one of the cooling component or the heat spreader. The heat transfer device includes a first portion and a second portion, where the first portion is coupled to one of the cooling component or the heat spreader and a second portion is protruded outwards relative to one of the cooling component or the heat spreader. In some examples, when the receptacle is disposed in a thermal contact and coupled to the cooling component, the first portion of the heat transfer device is disposed in thermal contact and coupled to the heat spreader. In such examples, when the removable device is detachably connected to the host device, the second portion of the heat transfer device extends through the receptacle, such that the plurality of spring fingers establish a direct thermal interface with the second portion to allow a waste-heat to transfer from the heat spreader to the cooling component via the heat transfer device and the receptacle. In some other examples, when the receptacle is disposed in thermal contact and coupled to the heat spreader, the first portion of the heat transfer device is disposed in thermal contact and coupled to the cooling component. In such examples, when the removable device is detachably connected to the host device, the second portion of the heat transfer device extends through the receptacle, such that the plurality of spring fingers establish the direct thermal interface with the second portion to allow the waste-heat to transfer from the heat spreader to the cooling component via the receptacle and the heat transfer device. In some examples, the heat transfer device is a heat pipe. In some other examples, the heat transfer device is a vapor chamber.

In one or more examples, each spring finger may apply an optimal contact force to allow easy plugging (e.g., inserting or sliding) of the removable device into the host device. For example, each spring finger may get compressed so as to deflect marginally towards a frame of the receptacle when the removable device is plugged into the host device. However, the optimal spring force exerted by each of the plurality of spring fingers may be sufficient to establish the direct thermal interface between the dry contact surface of each spring finger and the heat transfer device. In other words, the plurality of spring fingers may provide a multiplicity (array) of the contact force or spring force to create a substantially low insertion force for plugging the removable device into the host device. At the same time, the plurality of spring fingers may provide the multipoint contact conduction cooling of the removable device through the plurality of spring fingers for an effective thermal management of the removable device.

In some examples, the multiplicity of the contact force or spring force exerted by the plurality of spring fingers is within acceptable safety limits to avoid repetitive force (e.g., insertion force or removal force) related injuries. For example, the contact force or the spring force exerted by each spring finger may be in a range from about 0.04 pound-force to 0.08 pound-force. In some examples, each of the plurality of spring fingers may deflect in a range from about 0.5 millimeter to 1.0 millimeter to allow the removable device to be easily plugged into the host device. The plurality of spring fingers may be able to maintain the multipoint contact with the heat transfer device, even though the heat transfer device has a non-smooth surface, a non-flat surface, surface imperfections, or debris, because each spring finger may independently generate the optimal spring force to establish the direct thermal interface with the heat transfer device. Further, since each spring finger may use a substantially small surface area of the dry contact surface for independently exerting the spring force on the peripheral surface of the heat transfer device, the plurality of spring fingers may further maintain the multipoint contact with the heat transfer device having the aforementioned problems related to the surface. In some examples, the surface area of the dry contact surface of each spring finger may be in range from about 0.2 square millimeter to 0.6 square millimeter. Further, since the plurality of spring fingers are configured to establish the direct thermal interface with the heat transfer device, the need for a TIM to establish the thermal interface between the receptacle and the heat transfer device may be avoided. Accordingly, the usage of the plurality of spring fingers may overcome the aforementioned problems related to the TIM.

Further, since an amount of the forces applied by the plurality of spring fingers of the receptacle on the heat transfer device is controllable, examples described herein may not allow a transfer of a load of the interfacing components (i.e., receptacle and the heat transfer device) to any other components of the removable device, for example at least one of the circuit board, the one or more electronic components mounted on the circuit board, or the BGA used for mounting the one or more electronic components on the circuit board. Hence, examples described herein may prevent the transfer of the load from the interfacing components to the circuit board, the one or more electronic components, or the BGA, and damage to those components.

FIG. 1A depicts a perspective view of a host device 102 of an electronic system 100 (as shown in FIGS. 1C and 1D), having a cooling component 106. In one or more examples, the host device 102 may be a computing device, such as a server device, a storage device, a power conversion device, or a networking device, having a modular connector. In the example of FIG. 1A, the host device 102 is a networking device. In one or more examples, the host device 102 further includes a partially open housing 110 and a connector 112.

Figure 1B:
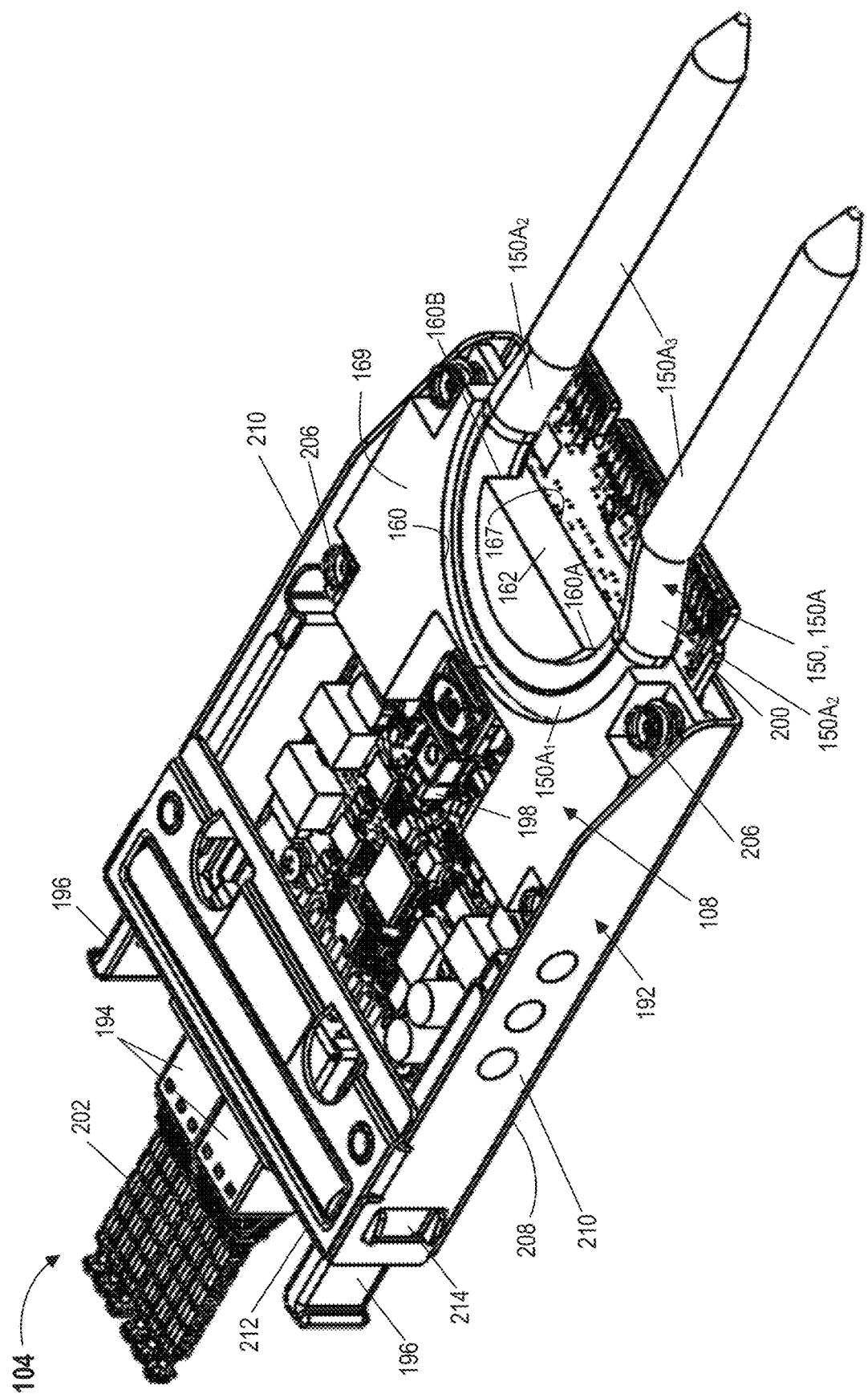
FIG. 1B illustrates a perspective view of a removable device having a heat spreader according to an example implementation of the present disclosure.

The partially open housing 110 is defined by a cover 114, a pair of side rails 116, and a rear panel 118. Each side rail of the pair of side rails 116 is coupled to one peripheral side of the cover 114. The rear panel 118 is coupled to a rear side of cover 114 and to the pair of side rails 116. The rear panel 118 includes a cut-out to allow the connector 112 to be inserted and coupled to the rear panel 118. Each side rail of the pair of side rails 116 includes a plurality of through openings 120 to allow the housing 110 to be coupled to a chassis (not shown in FIG. 1A) of the electronic system 100 using fasteners, such as screws, rivets, or the like. The rear side of the cover 114 includes a first protruded portion 122 having a plurality of first through recesses 124 to allow the cooling component 106 to be coupled to the housing 110. The front side of the housing 110 may receive a removable device 104 (as shown in FIGS. 1B, 10, and 1D) when connected to the host device 102.

The connector 112 (or a modular port) of the host device 102 may communicatively couple the removable device 104 to the host device 102, when it is connected to (plugged into) the housing 110 of the host device 102. For example, the connector 112 may have a slot (or socket) to receive a plug (i.e., a portion of a circuit board (not shown) of the removable device 104, and to communicatively couple the removable device 104 to the host device 102. In some examples, the connector 112 may be a networking device connector, a USB connector, a peripheral-component interconnect express (PCIe) connector, or the like. It may be noted herein that the terms "connector" and "modular port" may be used interchangeably. In the example of FIGS. 1A, 1C, and 1D, the connector 112 is a network switch that may allow the removable device 104 to be detachably coupled to the host device 102.

In the example of FIG. 1A, the cooling component 106 is a cold plate. In one or more examples, the cooling component 106 is a thermally conductive component, which may be disposed in thermal communication with a heat spreader 108 (shown in FIGS. 1B, 1C, and 1D) of the removable device 104, via a receptacle 136 and a heat transfer device 150 (shown in FIGS. 1B, 1C, and 1D), and may include provisions to allow a liquid coolant to flow through it for dissipating a waste-heat from the cooling component 106.

In the example of FIG. 1A, the cooling component 106 is a square-shaped thermally conductive component. In some examples, the cooling component 106 is made of a plurality of blocks 126 and a plenum 128 disposed there between and coupled to the plurality of blocks 126. In one or more examples, each block of the plurality of blocks 126 has a first recess 130. In some examples, a pair of first blocks 126A of the plurality of blocks 126 are disposed sequentially and coupled to one another such that the first recess of the pair of first blocks 126A are aligned and extend between a first end 132 and a second end 134 of the cooling component 106. Similarly, a pair of second blocks 126B of the plurality of blocks 126 are disposed sequentially and coupled to another such that the first recess of the pair of second blocks 1266 are aligned and extend between the first end 132 and the second end 134. In the example of FIG. 1A, the cooling component 106 includes four numbers of the plurality of blocks 126 and one plenum 128.

The plenum 128 includes a pair of peripheral walls 138, a front wall 140, a rear wall 142, a lid 144, and a base (not labeled), which are coupled to one another to define a hollow space there between. In some examples, the rear wall 142 has a fluid inlet 146 and a fluid outlet 148. In one or more examples, the pair of peripheral walls 138 is coupled to the plurality of blocks 126 such that the plenum 128 is in thermal contact with the plurality of blocks 126. Further, the front wall 140 includes a second protruded portion 152 having a plurality of second through recesses 154. In some examples, the second protruded portion 152 is disposed over the first protruded portion 122 such that the plurality of first and second through recesses 124, 154 are aligned to one another to allow the cooling component 106 to be coupled to the housing 110 via a fastener, such as screws, rivets, or the like. In some examples, the plenum 128 may further include an interior channel (not shown) disposed within the hollow space, and extending between the fluid inlet 146 and the fluid outlet 148, and such interior channel may be integral to a main body of the plenum 128. In some examples, the interior channel may include features, such as fins, pin fin arrays, surface roughening to increase the amount of its surface area that is exposed to the liquid coolant. In some other examples, the interior channel may also include other features, such as turbulators that enhance turbulence in the flow of the liquid coolant. In one or more examples, the features that enhance the surface area or the turbulence may result in increasing thermal performance of the liquid coolant. In some other examples, the plenum 128 may include a pipe or a tube that extends through the hollow space of the plenum 128, where the pipe or the tube may be a distinct part from the main body of the plenum 128.

In some examples, the fluid inlet 146 may be coupled to an inlet channel 155, and the fluid outlet 148 may be coupled to an outlet channel 156. In such examples, the fluid inlet 146 and the fluid outlet 148 may be sealed liquid tight to the inlet channel 155 and the outlet channel 156 respectively, using sealant, for example, a gasket, an adhesive, an O-ring, or the like. In some other examples, the fluid inlet 146 and the fluid outlet 148 may be soldered or brazed to the inlet channel 155 and the outlet channel 156 respectively. In one or more examples, the inlet channel 155 may be further coupled to a supply line manifold (not shown) that is fluidically connected to a coolant distribution unit (not shown). Similarly, the outlet channel 156 may be further coupled to a return line manifold (not shown) that is fluidically connected to the coolant distribution unit. In some examples, the coolant distribution unit may be a rack-level liquid cooling system, a row-level liquid cooling system, a datacenter-level liquid cooling system, or the like. In one or more examples, the coolant distribution unit may include a pump (not shown) that is configured to supply the liquid coolant to the plenum 128 of the cooling component 106 via the supply line manifold and the inlet channel 155, and receive a heated liquid coolant from the plenum 128 of the cooling component 106 via the outlet channel 156 and the return line manifold. It may be noted herein that the coolant distribution system may include a heat exchanger (not shown) to remove the waste-heat from the heated liquid coolant and regenerate the liquid coolant. The process of supplying the liquid coolant and receiving the heated liquid coolant may continue, as discussed herein above.

In one or more examples, the receptacle 136 is a thermally conductive component, which may be disposed in thermal contact with the cooling component 106 and coupled to the cooling component 106. For example, the receptacle 136 is disposed along and coupled to at least a portion of the first recess 130 such that an outer surface of a frame 157 of the receptacle 136 is in thermal contact with an inner surface of the cooling component 106, for example the block of the plurality of blocks 126. In the example of FIG. 1A, at least one receptacle 136 is disposed within the first recess 130 of each block of the plurality of blocks 126. The frame 157 of the receptacle 136 may be soldered to the inner surface of the cooling component 106, for example, the block of the plurality of blocks 126. In some examples, the solder may include a thermally conductive material, for example, a copper material, an aluminum material, or the like.

The receptacle 136 further includes a plurality of spring fingers 158 disposed in thermal contact with the frame 157 of the receptacle 136. In one or more examples, each of the plurality of spring fingers 158 is a thermally conductive component. In some examples, the plurality of spring fingers 158 are spaced apart from each other along a circumferential direction 10 of the electronic system 100 to form an array of spring fingers (as shown in 3A-3C, for example). In one or more examples, each of the plurality of spring fingers 158 may be defined by a first end, a second end, and a body interconnecting the first and second ends. In the example of FIG. 1A, each of the plurality of spring fingers 158 is a cantilever shaped spring finger 158A. In such examples, the first end, the second end, and the body of each spring finger 158 may have a substantially same size (e.g., width, thickness) to define the spring finger 158 having the cantilever shaped geometry. Further, the first end and the second end may be maintained at different heights by the body. The first end may be coupled to a portion of the frame 157 of the receptacle 136, and the second end may have a dry contact surface. In such examples, the first end may be soldered to an inner surface of the frame 157. In some examples, the solder may include a thermally conductive material, for example, a copper material, an aluminum material, or the like. In such examples, when the removable device 104 (having the heat transfer device 150 coupled to the heat spreader 108), is plugged into the host device 102, the second end of each spring finger 158 may be compressed so as to marginally deflect inwards, for example, towards the frame 157, where the deflection is in a range from about 0.5 millimeter to 1.0 millimeter in order to establish a direct thermal interface (or contact) with the heat spreader 108 of the removable device 104, via the heat transfer device 150. In some examples, each of the plurality of spring fingers 158 is a discrete component. In some other examples, the first end of each of the plurality of spring fingers 158 may be coupled or merged to one another to form a circular strip of plurality of spring fingers 158.

In some examples, the cooling component 106, the receptacle 136, and the plurality of spring fingers 158 may be formed of a thermally conductive material, such as copper, aluminum, or the like. The first and second protruded portions 122, 152 may be formed of a ferrous material, such as steel or the like. The inlet channel 155 and the outlet channel 156 may be formed of a polymer material. Further, each of the inlet and outlet channels 155, 156 respectively, may be a flexible channel.

FIG. 1B depicts a perspective view of a removable device 104 of an electronic system 100 (as shown in FIGS. 1C and 1D), having a heat spreader 108. In one or more examples, the removable device 104 may be a connectable electronic device (or a pluggable electronic device), for example, a communication device or a storage device. In some examples, the communication device may be a small form-factor pluggable (SFP) transceiver, a quad small form-factor pluggable transceiver coupled to an active optical cable (AOC), or the like. Similarly, the storage device may be a non-volatile memory express (NVMe) storage drive, or the like. It may be noted herein that the terms "removable device", "removable electronic device", "pluggable removable device", and "connectable electronic device" may be used interchangeably. In the example of FIG. 1B, the removable device 104 is a transceiver. In one or more examples, the removable device 104 further includes a partially open housing 192, a plurality of external connectors 194, a pair of latches 196, an optical assembly 198, a circuit board 200, and one or more electronic components (not shown in FIG. 1B) coupled to the circuit board 200.

The partially open housing 192 is defined by a base 208, a pair of peripheral walls 210, and a rear panel 212. Each wall of the pair of peripheral walls 210 is coupled to one peripheral side of the base 208. The rear panel 212 is coupled to a rear side of the base 208 and to the pair of peripheral walls 210. The rear panel 212 may include a cut-out (not shown) to allow the pair of external connectors 194 to be inserted and coupled to the circuit board 200 and/or to the optical assembly 198 via suitable communication mechanism, for example, cabling, or the like. Each wall of the pair of peripheral walls 210 includes a plurality of through openings 214 to allow a corresponding latch of the pair of latches 196 to be coupled to the housing 192 of the removable device 104. Each external connector of the pair of external connectors 194 may receive an optical cable 202, or the like. For example, each external connector 194 may have a slot (or socket) to receive the optical cable 202 and to communicatively couple the optical cable 202 to the circuit board 200 and/or to the optical assembly 198. In some examples, the circuit board 200 may be a rectangular or square shaped semiconductor component mounted on and coupled to the base 208 of the housing 192. In some examples, the one or more electronic components may include a processor, capacitors, resistors, or the like.

The heat spreader 108 is disposed at a front side of the removable device 104. In some examples, the heat spreader 108 is mounted on the circuit board 200 and/or the one or more electronic components. For example, the heat spreader 108 may be coupled to the base 208 of the housing 192 via the circuit board 200 using the plurality of spring loaded shoulder screws 206. In such examples, the plurality of spring loaded shoulder screws 206 is inserted via a plurality of through openings (not labeled) of the heat spreader 108 so as to couple the heat spreader 108 to the base 208. In some examples, the heat spreader 108 is in thermal communication with the circuit board 200 and/or the one or more electronic components. For example, each of the plurality of spring loaded shoulder screws 206 may exert an optimal load/force on the heat spreader 108 such that a flat lower surface 167 of the heat spreader 108 is in direct thermal communication with the one or more electronic components or the circuit board 200. In some other examples, the flat lower surface 167 of the heat spreader 108 may be in indirect thermal communication with the circuit board and/or one or more electronic components of the circuit board 200 via a TIM. In some examples, the TIM may be a polymer matrix, such as an epoxy or silicone resin, and thermally conductive fillers such as boron nitride, alumina, aluminum, zinc oxide, silver, or the like.

In the example of FIG. 1B, the heat spreader 108 is a rectangular-shaped thermally conductive solid component. As discussed herein, the heat spreader 108 may establish the direct thermal contact with a heat source, for example, the circuit board 200 and/or one or more electronic components mounted on the circuit board 200 via the flat lower surface 167. In such examples, the heat spreader 108 may further include an upper surface 169 having a second recess 160. In the example of FIG. 1B, the second recess 160 is a curved recess having a first end portion 160A and a second end portion 160B, which are located spaced apart from one another, and disposed at a front end 162 of the heat spreader 108.

In one or more examples, the electronic system 100 may further include a heat transfer device 150. In some examples, the heat transfer device 150 may be a thermally conductive component. In the example of FIG. 1B, the heat transfer device 150 is a heat pipe 150A. In some non-limiting examples, the heat transfer device 150 may be a vapor chamber (as shown in FIG. 4B). In the example of FIG. 1B, the heat pipe 150A is a "U"-shaped component. For example, the heat pipe 150A has a first portion $150A_1$, a pair of second portions $150A_3$, and a pair of body portions $150A_2$ interconnecting the first portion $150A_1$ and the pair of second portions $150A_3$. In some examples, the first portion $150A_1$ may be an evaporator section of the heat transfer device 150 and the pair of second portions $150A_3$ may be a condenser section of the heat transfer device 150. In the example of FIG. 1B, the first portion $150A_1$ is a curved portion, which may have a complementary profile to that of the second recess 160 of the heat spreader 108. Further, each second portion of the pair of second portions $150A_3$ may be a straight portion of the heat pipe 150A. Similarly, each body portion of the pair of body portions $150A_2$ may be a straight upward inclined portion of the heat pipe 150A. In one or more examples, the heat pipe 150A may be a two phase heat transfer device with a very high effective thermal conductivity. In one or more examples, the heat pipe 150A may be a vacuum tight device having a casing, a working fluid, and a wick structure. During operation, a waste-heat conducted to the heat pipe 150A from the heat source, for example, the heat spreader 108 may vaporize the working fluid (liquid phase) inside the wick structure in the first portion $150A_1$. The saturated vapor (gaseous phase) carrying the latent heat of vaporization may then flow towards the pair of second portions $150A_3$ via the pair of body portions $150A_2$. In the pair of second portions $150A_3$, the saturated vapor may condense and gives up its latent heat to the cooling component 106 to reproduce the working fluid (liquid phase). The condensed liquid may return to the first portion $150A_1$ through the wick structure by capillary action. The phase change processes and two-phase flow circulation continue as long as the temperature gradient is established and maintained between the first portion $150A_1$ and the pair of second portions $150A_3$.

In one or more examples, the heat transfer device 150 may be disposed along the second recess 160 and coupled to the heat spreader 108 via soldering. For example, the soldering may include a thermally conductive material, for example, a copper material, an aluminum material, or the like. In the example of FIG. 1B, the first portion $150A_1$ is disposed along the second recess 160 and coupled to the heat spreader 108. The pair of body portions $150A_2$ is disposed over a portion of the circuit board 200 such that a gap (not labeled) is formed there between the pair of body portions $150A_2$ and the circuit board 200. The pair of second portions $150A_3$ may extend outwardly beyond the circuit board 200. For example, the pair of second portions $150A_3$ may protrude outwards relative to the heat spreader 108. In one or more examples, the heat spreader 108 and the heat transfer device 150 may be formed of a thermally conductive material, such as copper, aluminum, or the like.

FIG. 1C depicts a perspective view of an electronic system 100 having a removable device 104 of FIG. 1B, detachably connected to a host device 102 of FIG. 1A. Similarly, FIG. 1D depicts a side view of the electronic system 100 of FIG. 1C. It may be noted herein that a housing 110 and a connector 112 of the host device 102 depicted in the example of FIG. 1A, are not shown in the example of FIG. 1C for ease of illustration purpose, and such an illustration should not be construed as a limitation of the present disclosure.

In some examples, the electronic system 100 is a compute infrastructure, such as a rack or an enclosure of a data center having the host device 102, such as a server device, a storage device, a power conversion device, or a networking device, and the removable device 104, such as a data communication device, or a storage drive. In one or more examples, the removable device 104 and the host device 102 may function as a plug and a socket of the compute infrastructure. In the example of FIGS. 1C and 1D, the host device 102 is the networking device having the connector, and the removable device 104 is the data communication device having a transceiver. In some examples, the connector may be an Ethernet switch, and the transceiver may be an SFP transceiver coupled to an AOC (not shown) or a QSFP transceiver coupled to the AOC.

Referring to FIG. 1D, the removable device 104 is slidably inserted into the housing 110 of the host device 102 so as to detachably couple the removable device 104 to the host device 102. For example, when the removable device 104 is connected to the host device 102, a portion 200A of a circuit board 200 of the removable device 104 is plugged into a slot 112A of the connector 112 of the host device 102. In other words, the circuit board 200 of the removable device 104 may be communicatively coupled to a circuit board (not shown) of the host device 102 via the connector 112. Accordingly, when the removable device 104 is connected to the host device 102, it may be held in non-movable condition, because the portion 200A of the circuit board 200 is plugged into the slot 112A of the connector 112. In such examples, a pair of second portions 150A$_3$ of the heat transfer device 150 is inserted into the host device 102 via the receptacle 136 (as shown in FIG. 1A) disposed in the first recess 130. In such examples, the plurality of spring fingers 158 (as shown in FIG. 1A) of the receptacle 136 may establish a direct thermal interface with each second portion of the pair of second portions 150A$_3$ of the heat transfer device 150 to allow a waste-heat to transfer from the heat transfer device 150 to the cooling component 106 via the receptacle 136, for example, via the frame 157 and each spring finger 158 (shown in FIG. 1A) of the receptacle 136.

In one or more examples, a first thermally conductive (a low resistance) path may be created between the heat source, such as the circuit board 200 (and/or the one or more electronic components), the heat spreader 108, and the first portion 150A$_1$ of the heat transfer device 150. Similarly, a second thermally conductive path may be created between each second portion 150A$_3$ of the heat transfer device 150, the plurality of spring fingers 158, the frame 157, and the cooling component 106. Further, a third thermally conductive path may be created between the cooling component 106 and the liquid coolant circuited within the cooling component 106. Thus, the electronic system 100 enables i) dissipation of the waste-heat from the circuit board 200 (and/or the electronic components) to the heat spreader 108, ii) transfer of the waste-heat from the heat spreader 108 to the heat transfer device 150, iii) transfer of waste-heat from first portion 150A$_1$ to the pair of second portions 150A$_3$, iv) transfer of the waste-heat from the heat transfer device 150 to the cooling component 106 via the receptacle 136, and v) dissipation of the waste-heat from the cooling component 106 to the liquid coolant.

In particular, during operation of the electronic system 100, the one or more electronic components and/or the circuit board 200, the external connector 194, and the optical assembly 198 of the removable device 104 may operate in tandem to transmit, receive, process, or store data. Accordingly, the removable device 104 may consume a greater amount of power, and may thereby produce an increased amount of the waste-heat. In such examples, the heat spreader 108 coupled to the circuit board 200 and/or the one or more electronic components coupled to the circuit board 200, may dissipate the waste-heat from those devices towards the heat pipe 150A. In some examples, the coolant liquid filled within the first portion 150A$_1$ of the heat pipe 150A may absorb the waste-heat to aid in dissipating the waste-heat from the circuit board 200 and/or the plurality of electronic components to the heat pipe 150A. The pair of body portions 150A$_2$ of the heat pipe 150A may transfer the waste-heat to the pair of second portions 150A$_3$ of the heat pipe 150A. The plurality of spring fingers 158, which is in thermal contact with the pair of second portions 150A$_3$ of the heat pipe 150A may transfer the waste-heat from the heat pipe 150A to the frame 157 of the receptacle 136. For example, the dry contact surface of each spring finger 158, which is in thermal contact with the peripheral surface of the pair of the second portions 150A$_3$, transfers the dissipated waste-heat from the removable device 104 to the receptacle 136 via the plurality of spring fingers 158 and the frame 157. Further, the receptacle 136 may transfer the waste-heat to the cooling component 106, for example, to the plurality of blocks 126 of the cooling component 106. Later, the coolant liquid flowing in the plenum 128 may absorb the waste-heat from the plurality of blocks 126 of the cooling component 106 and generate heated coolant (not labeled), thereby cooling the cooling component 106. The heated coolant liquid may be pumped outside of the electronic system 100 to exchange the heat with an external coolant (not shown) and regenerate the coolant liquid. Thus, in accordance to one or more examples of the present disclosure, the plurality of spring fingers 158 may provide the multipoint contact conduction cooling of the removable device 104 for an effective thermal management of the removable device 104.

In one or more examples, each spring finger 158 may apply an optimal contact force on the heat transfer device 150 to allow easy plugging (e.g., inserting or sliding) of the removable device 104 into the host device 102. For example, each spring finger 158 may get compressed to deflect marginally inwards, for example, towards the frame 157, when the removable device 104 is plugged into the host device 102. However, the optimal spring force exerted by each of the plurality of spring fingers 158 may be sufficient to establish the direct thermal interface between a dry contact surface of each spring finger 158 and a peripheral surface of the heat transfer device 150. In other words, the plurality of spring fingers 158 may provide a multiplicity (array) of the contact force or spring force to create a substantially low insertion force for plugging the removable device 104 into the host device 102. In some examples, the multiplicity of the contact force or the spring force exerted by the plurality of spring fingers 158 is within acceptable safety limits to avoid repetitive force (e.g., insertion force or removal force) related injuries. For example, the contact force or the spring force exerted by each spring finger 158 may be in a range from about 0.04 pound-force to 0.08 pound-force. In some examples, each of the plurality of spring fingers 158 may deflect in a range from about 0.5 millimeter to 1.0 millimeter to allow the heat transfer device 150 coupled to the removable device 104 to be easily plugged into the host device 102.

In one or more examples, the plurality of spring fingers 158 may be able to maintain the multipoint contact (i.e., via the dry contact surface of each spring finger) with the peripheral surface of the heat transfer device 150, even though the peripheral surface has a non-smooth surface, a non-flat surface, surface imperfections, or debris, because each spring finger 158 may independently generate the optimal spring force to establish the direct thermal interface with a mutually opposite portion of the peripheral surface. Further, each spring finger 158 may use a substantially small surface area of the dry contact surface for independently exerting the spring force on the peripheral surface. In some examples, the surface area of the dry contact surface of each spring finger 158 may be in range from about 0.2 square millimeter to 0.6 square millimeter. Since the dry contact surface of the plurality of spring fingers 158 establishes the direct thermal interface with the peripheral surface of the heat transfer device 150, the need for a TIM to establish the thermal interface (as per a conventional electronic system) between the receptacle 136 and the heat transfer device 150 may be avoided. Accordingly, the usage of the plurality of spring fingers 158 may overcome the aforementioned problems related to the TIM.

FIG. 2A depicts a perspective view of a portion of host device 302 of an electronic system, having a cooling component 306. In one or more examples, the host device 302 may further include a partially open housing and a connector (as shown in the example of FIG. 1A). It may be noted herein that the housing and the connector of the host device 302 are not shown in the example of FIG. 2A for ease of illustration purpose, and such an illustration should not be construed as a limitation of the present disclosure.

In some examples, the cooling component 306 is a cold plate. In one or more examples, the cooling component 306 is a thermally conductive component, which may be disposed in thermal communication with a heat spreader 308 of a removable device 304, via a receptacle 336 (shown in FIG. 2B) and a heat transfer device 350, and may include provisions to allow a liquid coolant to flow through it for dissipating a waste-heat from the cooling component 306.

As discussed in the example of FIG. 1A, the cooling component 306 is made of a plurality of first blocks 326 and a plenum 328 disposed there between and coupled to the plurality of first blocks 326. In one or more examples, each block of the plurality of first blocks 326 has a first recess 330. The plenum 328 includes a pair of peripheral walls 338, a front wall 340, a rear wall 342, a lid 344, and a base (not labeled), which are coupled to one another to define a hollow space there between. In some examples, the rear wall 342 has a fluid inlet 346 and a fluid outlet 348. In one or more examples, the pair of peripheral walls 338 is coupled to the plurality of first blocks 326 such that the plenum 328 is in thermal contact with the plurality of first blocks 326. Further, the front wall 340 includes a second protruded portion 352, which may be used to couple the cooling component 306 to the housing of the host device 302. In some examples, the fluid inlet 346 may be coupled to an inlet channel 355, and the fluid outlet 348 may be coupled to an outlet channel 356. In one or more examples, the inlet channel 355 may be further coupled to a supply line manifold (not shown) that is fluidically connected to a coolant distribution unit (not shown). Similarly, the outlet channel 356 may be further coupled to a return line manifold (not shown) that is fluidically connected to the coolant distribution unit.

In one or more examples, the electronic system may further include a pair of heat transfer devices 350. In some examples, each heat transfer device of the pair of heat transfer devices 350 may be a thermally conductive component. In the example of FIG. 2A, each heat transfer device of the pair of heat transfer devices 350 is a heat pipe 350A. In some non-limiting examples, each heat transfer device 350 may be a vapor chamber (as shown in FIG. 4B). The heat pipe 350A has a pair of first portions $350A_1$ and a pair of second portions $350A_2$. In some examples, each portion of the pair of first portions $350A_1$ may be an evaporator section of the heat pipe 350A, and each portion of the pair of second portions $350A_2$ may be a condenser section of the heat pipe 350A. In one or more examples, the heat pipe 350A may be a two phase heat transfer device with a very high effective thermal conductivity. In one or more examples, the heat pipe 350A may be a vacuum tight device having a casing, a working fluid, and a wick structure. In one or more examples, the heat pipe 350A may be disposed along the first recess 330 of each first block 326 and coupled to the cooling component 306 via soldering. In the example of FIG. 2A, the first portion $350A_1$ is disposed along the first recess 330 of each first block 326. Further, the first portion 350A1 is coupled to the cooling component 306. The pair of second portions $350A_2$ may extend outwardly beyond the cooling component 306. For example, the pair of second portions $350A_2$ may protrude outwards relative to the cooling component 306. In one or more examples, the cooling component 306 and the heat transfer device 350 may be formed of a thermally conductive material, such as copper, aluminum, or the like.

FIG. 2B depicts a perspective view of a removable device 304 of an electronic system, having a heat spreader 308. In one or more examples, the removable device 304 further includes a partially open housing 392, a plurality of external connectors 394, a pair of latches 396, an optical assembly 398, a circuit board 400, and one or more electronic components (not shown in FIG. 1B) coupled to the circuit board 400.

The partially open housing 392 is defined by a base, a pair of peripheral walls, and a rear panel 412. In some examples, the rear panel 412 may include a cut-out (not shown) to allow the pair of external connectors 394 to be inserted and coupled to the circuit board 400 and/or to the optical assembly 398 via suitable communication mechanism, for example, cabling, or the like. Each external connector of the pair of external connectors 394 may receive an optical cable 402, or the like. For example, each external connector 394 may have a slot (or socket) to receive the optical cable 402 and to communicatively couple the optical cable 402 to the circuit board 400 and/or to the optical assembly 398.

The heat spreader 308 is a thermally conductive solid component, disposed proximate to a front side of the removable device 304. In some examples, the heat spreader 308 is mounted on the circuit board 400 and/or the one or more electronic components and coupled to the base of the housing 392 using the plurality of spring loaded shoulder screws 404. In some examples, the heat spreader 308 is in thermal communication with the circuit board 400 and/or the one or more electronic components. For example, each of the plurality of spring loaded shoulder screws 404 may exert an optimal load/force on the heat spreader 308 such that a flat lower surface (not shown) of the heat spreader 308 is in direct thermal communication with the one or more electronic components or the circuit board 400. The heat spreader 308 may further include a plurality of second blocks 410 disposed on and coupled to an upper surface 369 of the heat spreader 308. Each block of the plurality of second blocks 410 includes a second recess 360. In some examples, a pair of blocks 410A of the plurality of second blocks 410 are disposed sequentially and coupled to one another such that the second recess of the pair of blocks 410A are aligned. Similarly, a pair of blocks 410B of the plurality of second blocks 410 are disposed sequentially and coupled to another such that the second recess of the pair of blocks 410B are aligned. In the example of FIG. 2B, the heat spreader 308 includes four second blocks 410 and each block includes a receptacle 336.

In one or more examples, the receptacle 336 is a thermally conductive component, which may be disposed in thermal contact with the heat spreader 308, for example, via the plurality of second blocks 410. For example, the receptacle 336 is disposed along and coupled to at least a portion of the second recess 360 such that an outer surface of a frame 357 of the receptacle 336 is in thermal contact with an inner surface of the heat spreader 308, for example the block of the plurality of second blocks 410. In the example of FIG. 1A, at least one receptacle 336 is disposed within the second recess 360 of each block of the plurality of second blocks 410. The frame 357 of the receptacle 336 may be soldered to the inner surface of the heat spreader 308, for example, the block of the plurality of second blocks 410. The receptacle 336 includes a plurality of spring fingers 358. In one or more examples, each of the plurality of spring fingers 358 is a thermally conductive component, which may be disposed in thermal contact with the frame 357 of the receptacle 336. In some examples, the plurality of spring fingers 358 are spaced apart from each other along a circumferential direction 10 of the electronic system to form an array of spring fingers (as shown in 3A-3C, for example). In one or more examples, each of the plurality of spring fingers 358 may be defined by a first end, a second end, and a body interconnecting the first and second ends. In the example of FIG. 2B, each of the plurality of spring fingers 358 is a torsional spring finger 358A. In such examples, the first end, the second end, and the body of each spring finger 358 may have substantially same size (e.g., width, thickness). Further, the second end is disposed at an offset distance relative to the first end. Additionally, the first and second ends are coupled to the portion of the frame 357, and the body having a dry contact surface, may bent inwardly relative to the frame 357. In such examples, the first end and the second end may be soldered to an inner surface of the frame 357 of the receptacle 336 using thermal conductive material. In some examples, when the removable device 304 is plugged into the host device 302 (having the heat transfer device 350 coupled to the cooling component 306), the body of each spring finger 358 may be compressed so as to marginally deflect inwards, for example, towards the frame 375, where the deflection is in a range from about 0.5 millimeter to 1.0 millimeter in order to establish a direct thermal interface (or contact) with the cooling component 306 of the host device 302, via the heat transfer device 350. In some examples, the heat spreader 308, the receptacle 336, and the plurality of spring fingers 358 may be formed of a thermally conductive material, such as copper, aluminum, or the like.

In one or more examples, the removable device 304 of FIG. 2B, may be detachably connected to a host device 302 of FIG. 2A to define an electronic system of the present disclosure. For example, the removable device 304 may be slidably inserted into the housing of the host device 302 so as to detachably couple the removable device 304 to the host device 302. For example, when the removable device 304 is connected to the host device 302, a portion 400A of the circuit board 400 is plugged into a slot (not shown) of the connector of the host device 102. In other words, the circuit board 400 of the removable device 304 may be communicatively coupled to a circuit board (not shown) of the host device 302 via the connector. In such examples, a second portion $350A_2$ of the pair of heat pipes 350A is inserted into the removable device 304 via the receptacle 336 disposed in the second recess 360. In such examples, the plurality of spring fingers 358 may establish a direct thermal interface with the second portion $350A_2$ of each heat pipe 350A to allow a waste-heat to transfer from the heat spreader 308 to the pair of heat pipes 350A via each spring finger 358 and the frame 357.

In one or more examples, a first thermally conductive path may be created between the heat source, such as the circuit board 400 (and/or the one or more electronic components), and the heat spreader 308. Further, a second thermally conductive path may be created between the heat spreader 308 and the second portion $350A_2$ of each heat pipe of the pair of heat pipes 350A via a corresponding receptacle 336 (for example, through and the plurality of spring fingers 358 and the frame 357). Similarly, a third thermally conductive path may be created between the first portion $350A_1$ of each heat pipe of the pair of heat pipes 350A and the cooling component 306. Further, a fourth thermally conductive path may be created between the cooling component 306 and the liquid coolant circuited within the cooling component 306. Thus, the electronic system enables i) dissipation of the waste-heat from the circuit board 400 (and/or the electronic components) to the heat spreader 308, ii) transfer of the waste-heat from the heat spreader 308 to the heat transfer device 350 via the plurality of spring fingers 358 and the frame 357, iii) transfer of waste-heat from second portion $350A_2$ to the first portion $350A_1$, iv) transfer of the waste-heat from the heat transfer device 350 to the cooling component 306, and v) dissipation of the waste-heat from the cooling component 306 to the liquid coolant.

Figure 3A:
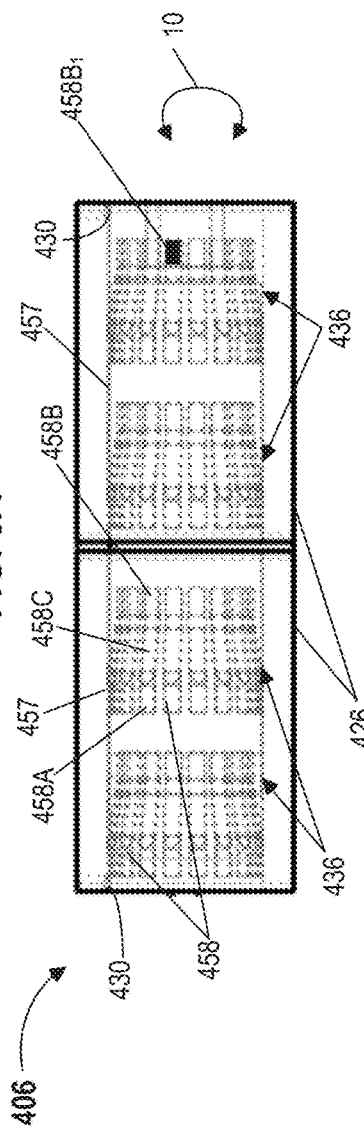
FIG. 3A illustrates a block diagram of a receptacle disposed within a cooling component according to an example implementation of the present disclosure.

FIG. 3A depicts a block diagram of a receptacle 436 disposed within one of a cooling component 406. It may be noted herein that the example of FIG. 3A may be a representation of a sectional view of the cooling component 406. Further, it may be noted herein that the receptacle 436 may be disposed within a heat spreader (not shown) without deviating from the scope of the present disclosure. In the example of FIG. 3A, the cooling component 406 includes a pair of blocks 426 disposed sequentially and coupled to one another such that a recess 430 formed in each block of the pair of blocks 426 are aligned to one another. In such examples, each block of the pair of blocks 426 includes two numbers of receptacle 436, which are disposed spaced apart from one another within the recess 430 such that an outer surface of each receptacle 436 is in a thermal contact with an inner surface of the cooling component 406, for example, each block 426. For example, each receptacle 436 includes a frame 457 having an outer surface coupled to the inner surface of the cooling component 406. In some examples, the frame 457 is a hollow cylindrical component.

As discussed in the example of FIG. 1A, the receptacle 436 further includes a plurality of spring fingers 458, which may be disposed in thermal contact with the frame 457. In some examples, the plurality of spring fingers 458 are spaced apart from each and disposed along a circumferential direction 10 of an electronic system, to form an array of spring fingers. In one or more examples, each of the plurality of spring fingers 458 may be defined by a first end 458A, a second end 458B, and a body 458C interconnecting the first and second ends 458A, 458B respectively. In the example of FIG. 1A, each of the plurality of spring fingers 458 may have a cantilever shaped structure. In such examples, the first end 458A, the second end 458B, and the body of 458C of each spring finger 458 may have a substantially same size (e.g., width, thickness) to define the spring finger 458 having the cantilever shaped geometry. Further, the first end 458A and the second end 458B is maintained at different heights by the body 458C. Further, the first end 458A is coupled to the portion of the frame 457. For example, the first end 458A is coupled to an inner surface of the frame 457. In such examples, the first end 458A may be soldered to the inner surface of the frame 457. The second end 458B may have a dry contact surface $458B_1$. The cooling component 406, the receptacle 436, and the plurality of spring fingers 458 are made of the thermal conductive material, for example, a copper material, an aluminum material, or the like.

In one or more examples, when a removable device (having a heat transfer device rigidly coupled to the heat spreader) is plugged into a host device, the second end 458B of each spring finger 458 may be compressed by the heat transfer device so as to marginally deflect each spring finger 458 inwards, for example, towards the frame 457 in order to establish a thermal interface (or contact) with the cooling component 406 via the receptacle 436. For example, the dry contact surface $458B_1$ of each spring finger 458 contacts a peripheral surface of the heat transfer device in order to establish the thermal interface there between the cooling component 406 and the heat spreader via the heat transfer device and the receptacle 436 (for example, via the plurality of spring fingers 458, and the frame 457). In such examples, the heat transfer device may transfer a waste-heat from the heat spreader to the cooling component 406 via each spring finger 458 and the frame 457.

Figure 3B:
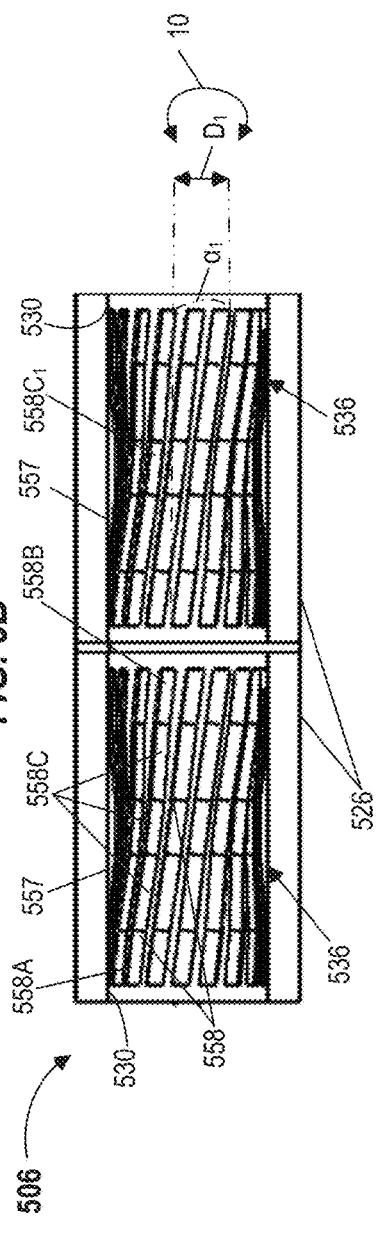
FIG. 3B illustrates a block diagram of a receptacle disposed within a cooling component according to another according to another example implementation of the present disclosure.

FIG. 3B depicts a block diagram of a receptacle 536 disposed within one of a cooling component 506. It may be noted herein that the receptacle 536 may be disposed within a heat spreader (not shown) without deviating from the scope of the present disclosure. In the example of FIG. 3B, the cooling component 506 includes a pair of blocks 526 disposed sequentially and coupled to one another such that a recess 530 formed in each block of the pair of blocks 526 are aligned to one another. In such examples, each block of the pair of blocks 526 includes one receptacle 536, which is disposed within the recess 530 such that an outer surface of the receptacle 536 is in thermal contact with an inner surface of the cooling component 506, for example, each block 526.

As discussed in the example of FIG. 1A, the receptacle 536 includes a frame 557 and a plurality of spring fingers 558. The frame 557 is a hollow cylindrical component, which may be disposed in thermal contact with the cooling component 506 and the plurality of spring fingers 558 may be disposed in thermal contact with the frame 557. In some examples, the plurality of spring fingers 558 are spaced apart from each and disposed along a circumferential direction 10 of an electronic system, to form an array of spring fingers. In one or more examples, each of the plurality of spring fingers 558 may be defined by a first end 558A, a second end 558B, and a body 558C interconnecting the first and second ends 558A, 558B respectively. In the example of FIG. 1A, each of the plurality of spring fingers 558 is a torsional spring finger. In such examples, the second end 558B is offset by a distance "D1" relative to first end 558A such that the body 558C is disposed at angle "$\alpha_1$" relative to first end 558A to define each spring finger 558 having the torsional shaped geometry. Further, the first end 558A and the second end 558B are coupled to an inner surface of the frame 557 and the body 558C is bent inwardly from the inner surface of the receptacle 536. In such examples, the first end 558A and the second end 558B may be soldered to the inner surface of the frame 557. The body 558C may have a dry contact surface 558$C_1$. The cooling component 506, the receptacle 536, and the plurality of spring fingers 558 are made of the thermal conductive material, for example, a copper material, an aluminum material, or the like.

In one or more examples, when a removable device (having a heat transfer device rigidly coupled to the heat spreader) is plugged into a host device, the body 558C of each spring finger 558 may be compressed by the heat transfer device so as to marginally deflect each spring finger 558 inwards, for example, towards the frame 557 in order to establish a thermal interface (or contact) with the cooling component 506 via the receptacle 536. For example, the dry contact surface 558$C_1$ of each spring finger 558 contacts a peripheral surface of the heat transfer device in order to establish the thermal interface there between the cooling component 506 and the heat spreader via the heat transfer device and the receptacle 536 (for example, via the plurality of spring fingers 558 and the frame 557). In such examples, the heat transfer device may transfer a waste-heat from the heat spreader to the cooling component 506 via each spring finger 558 and the frame 557.

Figure 3C:
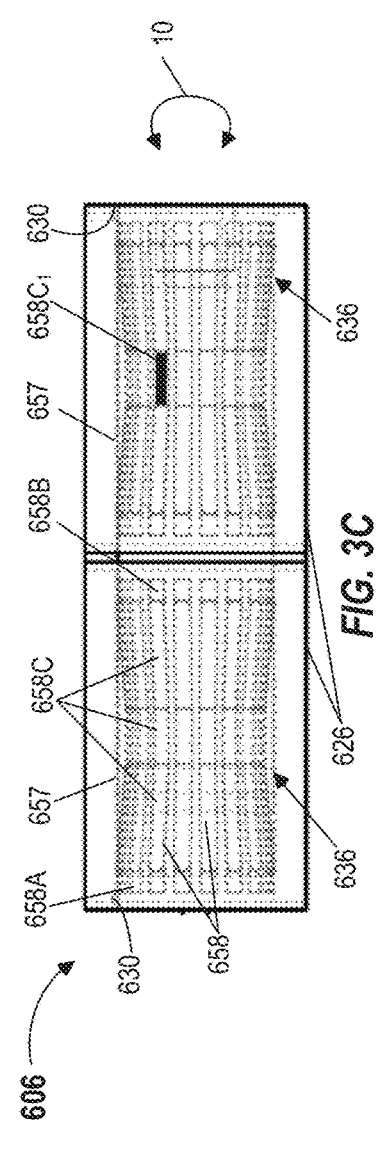
FIG. 3C illustrates a block diagram of a receptacle disposed within a cooling component according to yet another example implementation of the present disclosure.

FIG. 3C depicts a block diagram of a receptacle 636 disposed within one of a cooling component 606. In the example of FIG. 3C, the cooling component 606 includes a pair of blocks 626 disposed sequentially and coupled to one another such that a recess 630 formed in each block of the pair of blocks 626 are aligned to one another. In such examples, each block of the pair of blocks 626 includes one receptacle 636, which is disposed within the recess 630 such that an outer surface of the receptacle 636 is in thermal contact with an inner surface of the cooling component 606, for example, each block 626.

As discussed in the example of FIG. 1A, the receptacle 636 includes a frame 657 and a plurality of spring fingers 658. The frame 557 is a hollow cylindrical component, which may be disposed in thermal contact with the cooling component 606 and the plurality of spring fingers 658 may be disposed in thermal contact with the frame 657. In some examples, the plurality of spring fingers 658 are spaced apart from each and disposed along a circumferential direction 10 of an electronic system, to form an array of spring fingers. In one or more examples, each of the plurality of spring fingers 658 may be defined by a first end 658A, a second end 658B, and a body 658C interconnecting the first and second ends 658A, 658B respectively. In some examples, the first end 658A and the second end 658B are coupled to an inner surface of the frame 657 and the body 658C is bent inwardly from the inner surface of the frame 657. In such examples, the first end 658A and the second end 658B may be soldered to the inner surface of the frame 657. The body 658C may have a dry contact surface 658$C_1$.

In one or more examples, when a removable device (having a heat transfer device rigidly coupled to the heat spreader, not shown) is plugged into a host device, the body 658C of each spring finger 658 may be compressed by the heat transfer device so as to marginally deflect each spring finger 658 inwards, for example, towards the frame 657 in order to establish a thermal interface (or contact) with the cooling component 606 via the receptacle 636. For example, the dry contact surface 658$C_1$ of each spring finger 658 contacts a peripheral surface of the heat transfer device in order to establish the thermal interface there between the cooling component 606 and the heat spreader via the heat transfer device and the receptacle 636 (for example, via the plurality of spring fingers 658 and the frame 657). In such examples, the heat transfer device may transfer a waste-heat from the heat spreader to the cooling component 606 via each spring finger 658 and the frame 657.

FIG. 4A depicts a perspective view of a portion of host device 702 of an electronic system, having a cooling component 706. It may be noted herein that a housing and a connector of the host device 702 are not shown in the example of FIG. 4A for ease of illustration purpose, and such an illustration should not be construed as a limitation of the present disclosure.

In some examples, the cooling component 706 is a cold plate. In one or more examples, the cooling component 706 is a thermally conductive component, which may be disposed in thermal communication with a heat spreader 708 of a removable device 704, via a receptacle 736 and a heat transfer device 750, and may include provisions to allow a liquid coolant to flow through it for dissipating a waste-heat from the cooling component 706.

The cooling component 706 is a box-shaped component having a pair of peripheral walls 738, a front wall 740, a rear wall 742, a lid 744, and a base (not labeled), which are coupled to one another to define a hollow space there between. In some examples, the rear wall 742 has a fluid inlet 746 and a fluid outlet 748. In some examples, the fluid inlet 746 may be coupled to an inlet channel 755, and the fluid outlet 748 may be coupled to an outlet channel 756.

In one or more examples, the receptacle 736 is a thermally conductive component, which may be disposed in thermal contact with the cooling component 706. The receptacle 736 includes a frame 757 that is coupled to the front wall 740 of the cooling component 706. In some examples, the frame 757 may be soldered to the front wall 740 using thermal conductive soldering material. The receptacle 736 further includes a plurality of spring fingers 758. In one or more examples, each of the plurality of spring fingers 758 is a thermally conductive component, which may be disposed in thermal contact with the frame 757. In some examples, the plurality of spring fingers 758 are spaced apart from each other along a lateral direction 30 of an electronic system and coupled to an inner surface of the frame 757 to form an array of spring fingers. In one or more examples, each of the plurality of spring fingers 758 may be defined by a first end 758A, a second end 758B, and a body 758C interconnecting the first and second ends 758A, 758B respectively. In such examples, the body 758C is coupled to the frame 757. The first and second ends 758A, 758B are disposed facing one another, bent inwardly relative to the receptacle 736, and has a dry contact surface $758A_1$, $758B_1$ to establish the direct thermal interface with the heat transfer device 750. In some examples, when the removable device 704 (having the heat transfer device 750 rigidly coupled to the cooling component 706) is plugged into the host device 702, the first and second ends 758A, 758B respectively of each spring finger 758 may be compressed so as to marginally deflect inwards, for example, along a longitudinal direction 20 in order to establish a direct thermal interface (or contact) with the cooling component 706 of the host device 702, via the heat transfer device 750.

FIG. 4B depicts a perspective view of a removable device 704 of an electronic system, having a heat spreader 708. In one or more examples, the removable device 704 further includes a partially open housing 792, a plurality of external connectors 794, a pair of latches 796, an optical assembly 798, a circuit board 800, and one or more electronic components (not shown in FIG. 1B) coupled to the circuit board 800.

The partially open housing 792 is defined by a base, a pair of peripheral walls, and a rear panel 812. In some examples, the rear panel 812 may include a cut-out (not shown) to allow the pair of external connectors 794 to be inserted and coupled to the circuit board 800 and/or to the optical assembly 798 via a suitable communication mechanism, for example, cabling, or the like. Each external connector of the pair of external connectors 794 may receive an optical cable 802, or the like. For example, each external connector 794 may have a slot (or socket) to receive the optical cable 802 and to communicatively couple the optical cable 802 to the circuit board 800 and/or to the optical assembly 798.

The heat spreader 708 is a thermally conductive solid component, disposed proximate to a front side of the removable device 704. In some examples, the heat spreader 708 is mounted on the circuit board 800 and/or the one or more electronic components and coupled to the base of the housing 792 using the plurality of spring loaded shoulder screws 804. In some examples, the heat spreader 708 is in thermal communication with the circuit board 800 and/or the one or more electronic components. For example, each of the plurality of spring loaded shoulder screws 804 may exert an optimal load/force on the heat spreader 808 such that a flat lower surface (not shown) of the heat spreader 708 is in direct thermal communication with the one or more electronic components or the circuit board 400.

In one or more examples, the electronic system may further include a heat transfer device 750. In some examples, the heat transfer device 750 may be a thermally conductive component, for example, a vapor chamber 750A. The vapor chamber 750A has a first portion $750A_1$ and a second portion $750A_2$. In some examples, the first portion $750A_1$ may be an evaporator section of the vapor chamber 750A, and the second portion $750A_2$ may be a condenser section of the vapor chamber 750A. In one or more examples, the vapor chamber 750A may be a two phase heat transfer device with a very high effective thermal conductivity. In one or more examples, the vapor chamber 750A may be a vacuum tight device having a casing, a working fluid, and a wick structure. In one or more examples, the vapor chamber 750A may be disposed over an outer surface of the heat spreader and thermally coupled to the heat spreader 708 via soldering. For example, the first portion $750A_1$ of the vapor chamber 750A is disposed over and coupled to the heat spreader 708, and the second portion $750A_2$ of the vapor chamber 750A may protrude outwards relative to the heat spreader 708.

Figure 4C:
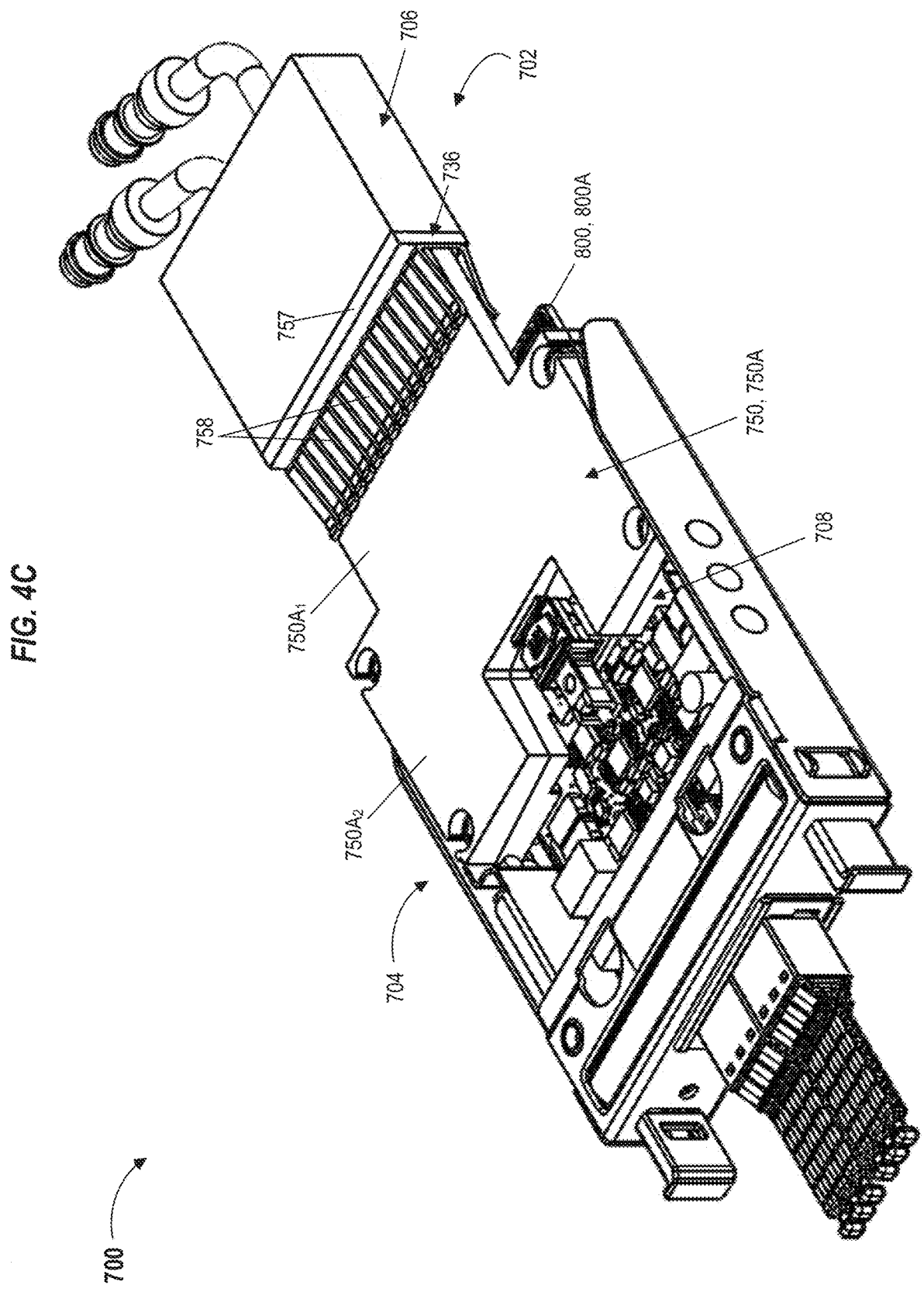
FIG. 4C illustrates a perspective view of an electronic system having the removable device of FIG. 4B connected to the host device of FIG. 4A according to yet another example implementation of the present disclosure.
Figure 5:
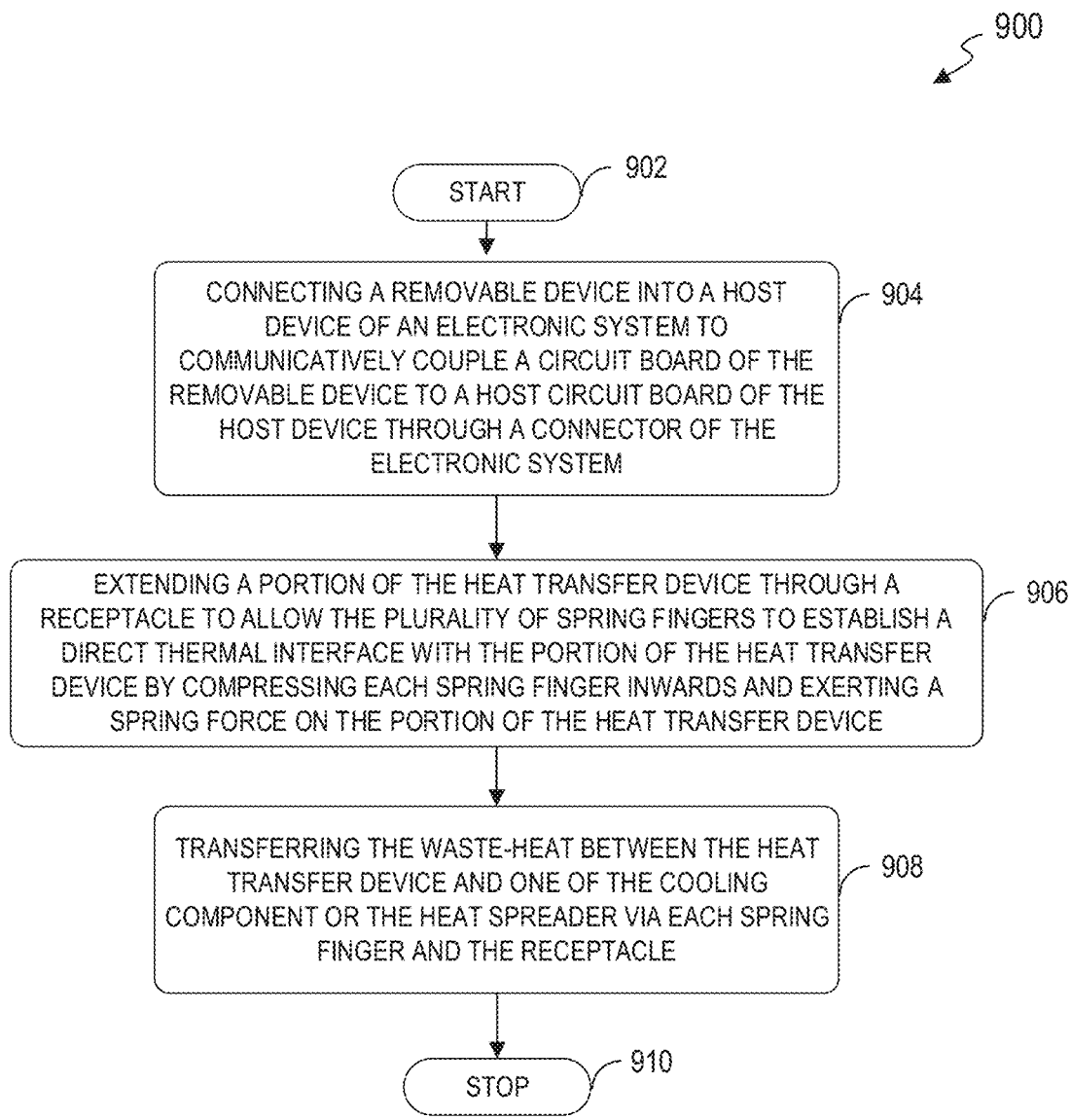
FIG. 5 illustrates a flowchart depicting a method of thermal management of a removable device according to an example implementation of the present disclosure.

FIG. 4C depicts a perspective view of an electronic system 700 having the removable device 704 of FIG. 4B connected to the cooling component 706 of FIG. 4A. In one or more examples, the removable device 704 may be detachably connected to a host device 702 to define the electronic system 700. For example, the removable device 704 may be slidably inserted into the housing of the host device 702 so as to detachably couple the removable device 704 to the host device 702. For example, when the removable device 704 is connected to the host device 702, a portion 800A of the circuit board 800 is plugged into a slot (not shown) of the connector (not shown) of the host device 702. In other words, the circuit board 800 of the removable device 704 may be communicatively coupled to a circuit board (not shown) of the host device 702 via the connector. In such examples, a second portion $750A_2$ of the vapor chamber 750A is inserted into the host device 702 via the receptacle 736. In one or more examples, the plurality of spring fingers 758 of the receptacle 736 may establish a direct thermal interface with the second portion $750A_2$ of the vapor chamber 750A to allow a waste-heat to transfer from the heat spreader 708 to the cooling component 706 via the heat transfer device 750 and the receptacle 736 (for example, via each spring finger 758 and the frame 757).

In one or more examples, a first thermally conductive path may be created between the heat source, such as the circuit board 800 (and/or the one or more electronic components), and the heat spreader 708. Further, a second thermally conductive path may be created between the first portion $750A_1$ of the vapor chamber 750A and the heat spreader 708. Similarly, a third thermally conductive path may be created between the second portion $750A_2$ of the vapor chamber 750A and the cooling component 706 via the plurality of spring fingers 758 and the frame 757. Further, a fourth thermally conductive path may be created between the cooling component 706 and the liquid coolant circuited within the cooling component 706. Thus, the electronic system 100 enables i) dissipation of the waste-heat from the circuit board 800 (and/or the electronic components) to the heat spreader 708, ii) transfer of the waste-heat from the heat spreader 708 to the heat transfer device 750, iii) transfer of the waste-heat from the first portion $750A_1$ to the second portion $750A_2$, iv) transfer of the waste-heat from the heat transfer device 750 to the cooling component 706 via the plurality of spring fingers 758 and the frame 757, and v) dissipation of the waste-heat from the cooling component 706 to the liquid coolant.

FIG. 5 is a flow diagram depicting a method 900 of a thermal management of a removable device. It should be noted herein that the method 900 is described in conjunction with FIGS. 1A-1C, for example. The method 900 may also be described in conjunction with FIGS. 2A-2B or FIGS. 4A-4C.

The method 900 starts at block 902 and continues to block 904. At block 904, the method 900 includes connecting a removable device into a host device of an electronic system to communicatively couple a circuit board of the removable device to a host circuit board of the host device through a connector, as described in FIGS. 1A and 1B. In some examples, a portion of the circuit board is inserted into an opening of the connector to communicatively couple the circuit board to the host circuit board. In some examples, a receptacle of an electronic system is coupled to a cooling component of the host device. In such examples, a first portion of a heat transfer device of the electronic system is coupled to a heat spreader of the removable device and a second portion of the heat transfer device protrudes outwards relative to the heat spreader. In some other examples, the receptacle is coupled to the heat spreader. In such examples, the first portion of the heat transfer device is coupled to the cooling component and the second portion of the heat transfer device protrudes outwards relative to the cooling component. In all such examples, the receptacle may include a frame, for example, a hollow cylindrical component and a plurality of spring fingers coupled to the frame. In one example, the heat transfer device is a heat pipe. In some other examples, the heat transfer device is a vapor chamber.

Further, the method 900 continues to block 906. At block 906, the method 900 includes the step of extending a portion, for example, the second portion of the heat transfer device through the receptacle to allow the plurality of spring fingers to establish a direct thermal interface with the second portion by compressing each spring finger inwards, for example, towards the receptacle and exerting a spring force on the portion of the heat transfer device.

In one or more examples, each spring finger may deflect marginally towards the frame when the removable device is plugged into the host device. However, the optimal spring force exerted by each of the plurality of spring fingers may be sufficient to establish the direct thermal interface between the dry contact surface of each spring finger and the peripheral surface of the heat transfer device. The plurality of spring fingers may provide a multiplicity (array) of the contact force or spring force to create a substantially low insertion force for plugging the removable device into the host device. At the same time, the optimal spring force exerted by each of the plurality of spring fingers may be sufficient to establish the direct thermal interface between the dry contact surface of each spring finger and the peripheral surface of the heat transfer device.

At block 908, the method 900 includes transferring a waste-heat between the heat transfer device and one of the cooling component or the heat spreader via each spring finger and the receptacle. In some examples, the removable device may convert electrical signals into optical signals or vice versa for transmitting or receiving data through an interconnecting cable. In some other examples, the removable device may store and process the data. Accordingly, the removable device may consume a greater amount of power, and may thereby produce an increased amount of the waste-heat. In some examples, when the receptacle is disposed in thermal contact with the heat spreader, the heat spreader may first dissipate the waste-heat generated by the circuit board and/or the electronic components. Later, the waste-heat may get transferred from the heat spreader to the heat transfer device via the plurality of spring fingers and the frame. Further, the heat transfer device may transfer the waste-heat to the cooling device. In such examples, a coolant liquid flowing in the cooling component may absorb the waste-heat from the cooling component and generate heated coolant, thereby cooling the cooling component. In some other examples, when the receptacle is disposed in thermal contact with the cooling component, the heat spreader may first dissipate the waste-heat generated by the removable device. Later, the waste-heat may get directly transferred from the heat spreader to the heat transfer device. Further, the heat transfer device may transfer the waste-heat to the cooling device via the receptacle and the plurality of spring fingers. In such examples, the coolant liquid flowing in the cooling component may absorb the waste-heat from the cooling component and generate heated coolant, thereby cooling the cooling component.

In one or more examples, the heated coolant liquid may be pumped outside of an electronic system to exchange the heat with an external coolant and regenerate the coolant liquid. Thus, in accordance to one or more examples of the present disclosure, the plurality of spring fingers coupled to the receptacle may provide the multipoint contact conduction cooling of the removable device through the plurality of spring fingers and the receptacle for effective thermal management of the removable device. The method 900 ends at block 910.

Various features as illustrated in the examples described herein may be implemented in a system, such as a host device and method for a thermal management of a removable device. In one or more examples, the array of spring fingers maintains an optimal contact force while plugging the removable device into the host device, which is within acceptable safety limits to avoid repetitive force (e.g., insertion force or removal force) related injuries. Further, the plurality of spring fingers may be able to maintain the multipoint contact (i.e., via the dry contact surface) with the peripheral surface of the removable device, even though the peripheral surface has a non-smooth surface, a non-flat surface, surface imperfections, or debris, because each spring finger may independently generate the optimal spring force to establish the direct thermal interface with a mutually opposite portion of the peripheral surface. Further, each spring finger may use a substantially small surface area of the dry contact surface for independently exerting the spring force on the peripheral surface. Hence, the plurality of spring fingers may be able to further maintain the multipoint contact (i.e., via the dry contact surface) with the peripheral surface having the aforementioned problems. Since the plurality of spring fingers establishes the direct thermal interface with the peripheral surface of the removable device, the need for a TIM to establish the thermal interface (as per a conventional electronic system) between the interfacing surfaces may be avoided. The plurality of spring fingers may generate an optimal force to compress a heat transfer device and establish and maintain thermal communication between heat transfer device and one of a cooling component or the heat spreader. Further, the spring forces may be controlled to prevent the transfer of load of interfacing components (i.e., cooling component and heat spreader) to other components of the removable device, and damages to those components.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:
1. An electronic system comprising:
   a host device comprising a cooling component;

a removable device comprising a heat spreader, wherein the removable device is detachably connectable to the host device;
a receptacle comprising a plurality of spring fingers, coupled to the cooling component; and
a heat transfer device comprising a first portion and a second portion, wherein the first portion is coupled to the heat spreader, and the second portion is protruded outwards relative to the heat spreader, wherein, when the removable device is connected to the host device, the second portion extends through the receptacle such that the plurality of spring fingers establish a direct thermal interface with the second portion and thermally couple the heat spreader to the cooling component to allow a waste-heat to transfer between the cooling component and the heat spreader via the heat transfer device and the receptacle.

2. The electronic system of claim 1, wherein the heat transfer device comprises one of a heat pipe or a vapor chamber.

3. The electronic system of claim 1, wherein the cooling component comprises a first recess and the heat spreader comprises a second recess, wherein the receptacle is disposed along the first recess and coupled to the cooling component, and wherein the first portion of the heat transfer device is disposed along the second recess and coupled to the heat spreader.

4. The electronic system of claim 3, wherein the cooling component is a cold plate, wherein the cold plate comprises a fluid inlet, a fluid outlet, and a plenum fluidically connecting the fluid inlet and the fluid outlet, wherein the plenum is in a thermal communication with the first recess, and wherein a liquid coolant is directed from the fluid inlet to the fluid outlet for dissipating the waste-heat from the cold plate.

5. The electronic system of claim 1, wherein the cooling component comprises a first recess and the heat transfer device comprises a second recess, wherein the receptacle is disposed along the second recess and coupled to the heat spreader, wherein the first portion of the heat transfer device is disposed along the first recess and coupled to the cooling component, and wherein when the removable device is connected to the host device, the second portion extends through the receptacle to thermally couple the cooling component to the heat spreader via the heat transfer device and the receptacle.

6. The electronic system of claim 5, wherein the cooling component is a cold plate, wherein the cold plate comprises a fluid inlet, a fluid outlet, and a plenum fluidically connecting the fluid inlet and the fluid outlet, wherein the plenum is in a thermal communication with the first recess, and wherein a liquid coolant is directed from the fluid inlet to the fluid outlet for dissipating the waste-heat from the cold plate.

7. The electronic system of claim 1, wherein each spring finger comprises a first end coupled to a frame of the receptacle, a second end having a dry contact surface to establish the direct thermal interface with the heat transfer device, and a body interconnecting the first and second ends, and wherein the plurality of spring fingers are arranged adjacent to one another along a circumferential direction to form an array of spring fingers.

8. The electronic system of claim 1, wherein each spring finger comprises a first end and a second end coupled to a frame of the receptacle, and a body interconnecting the first and second ends, wherein the body is bent inwardly relative to the frame and includes a dry contact surface to establish the direct thermal interface with the heat transfer device, and wherein the plurality of spring fingers are arranged adjacent to one another along a circumferential direction to form an array of spring fingers.

9. The electronic system of claim 8, wherein the second end is offset relative to the first end such that the body is disposed at angle relative to the first end.

10. The electronic system of claim 1, wherein each spring finger comprises a first end, a second end, and a body interconnecting the first and second ends, coupled to a frame of the receptacle, wherein the first and second ends are disposed facing one another, bent inwardly relative to the frame, and has a dry contact surface to establish the direct thermal interface with the heat transfer device, and wherein the plurality of spring fingers are arranged adjacent to one another along a lateral direction to form an array of spring fingers.

11. The electronic system of claim 1, wherein the host device further comprises a connector rigidly coupled to a housing of the electronic system, and a host circuit board coupled to the connector, wherein the removable device further comprises a circuit board, and wherein the circuit board is communicatively coupled to the host circuit board through the connector when the removable device is connected to the host device.

12. The electronic system of claim 1, wherein the host device is a switch, and wherein the removable device is a transceiver.

13. An electronic system comprising:
an electronic device for removably coupling with a host device comprising a host circuit board, a connector coupled to the host circuit board, and a cooling component, wherein the electronic device comprises:
a circuit board comprising a heat generating component and an electrical connector configured to, in an installed state of the electronic device in the host device, mate with the connector of the host device;
a heat spreader coupled to the heat generating component to dissipate heat generated by the heat generating component; and
a heat transfer device comprising a first portion and a second portion, wherein the first portion is coupled to the heat spreader, and the second portion is protruded outwards relative to the heat spreader along a direction of insertion of the electronic device into the host device, the second portion protruding beyond the circuit board;
wherein the second portion of the heat transfer device is configured to, in the installed state of the electronic device in the host device, be received within a receptacle of the host device comprising a plurality of spring fingers such that the plurality of spring fingers establish a direct thermal interface with the second portion and thermally couple the heat spreader to the cooling component to allow the waste-heat to transfer from the heat spreader to the cooling component coupled to the receptacle via the first and second portions of the heat transfer device and the receptacle.

14. The electronic system of claim 13, wherein the heat transfer device comprises one of a heat pipe or a vapor chamber.

15. The electronic system of claim 13, wherein the cooling component comprises a first recess and the heat transfer device comprises a second recess, wherein the receptacle is disposed along the second recess and coupled to the heat spreader, and wherein the first portion of the heat transfer device is disposed along the first recess and coupled to the cooling component.

16. The electronic system of claim 15, wherein the cooling component is a cold plate, wherein the cold plate comprises a fluid inlet, a fluid outlet, and a plenum fluidically connecting the fluid inlet and the fluid outlet, wherein the plenum is in a thermal communication with the first recess, and wherein a liquid coolant is directed from the fluid inlet to the fluid outlet for dissipating the waste-heat from the cold plate.

17. The electronic system of claim 13, wherein each spring finger comprises a first end coupled to a frame of the receptacle, a second end having a dry contact surface to establish the direct thermal interface with the heat transfer device, and a body interconnecting the first and second ends, and wherein the plurality of spring fingers are arranged adjacent to one another along a circumferential direction to form an array of spring fingers.

18. The electronic system of claim 13, wherein each spring finger comprises a first end and a second end coupled to a frame of the receptacle, and a body interconnecting the first and second ends, wherein the body is bent inwardly relative to the frame and includes a dry contact surface to establish the direct thermal interface with the heat transfer device, and wherein the plurality of spring fingers are arranged adjacent to one another along a circumferential direction to form an array of spring fingers.

19. The electronic system of claim 18, wherein the second end is offset relative to the first end such that the body is disposed at angle relative to the first end.

20. The electronic system of claim 13, wherein each spring finger comprises a first end, a second end, and a body interconnecting the first and second ends, coupled to a frame of the receptacle, wherein the first and second ends are disposed facing one another, bent inwardly relative to the frame, and have a dry contact surface to establish the direct thermal interface with the heat transfer device, and wherein the plurality of spring fingers are arranged adjacent to one another along a lateral direction to form an array of spring fingers.

21. A method comprising:
connecting a removable device into a host device of an electronic system to communicatively couple a circuit board of the removable device to a host circuit board of the host device via a connector of the host device,
   wherein the removable device comprises a heat spreader coupled to the circuit board to dissipate a waste-heat generated from the circuit board,
   wherein the host device comprises a cooling component,
   wherein the electronic system further comprises a receptacle and a heat transfer device comprising a first portion and a second portion, wherein the receptacle comprises a plurality of spring fingers, coupled to the cooling component, and wherein the first portion is coupled to the heat spreader, and the second portion is protruded outwards relatively to the heat spreader along a direction of connection of the removable device into the host device; and
extending the second portion through the receptacle to allow the plurality of spring fingers to establish a direct thermal interface with the second portion by compressing each spring finger inwards and exerting a spring force on the second portion, and
thermally couple the heat spreader to the cooling component to allow transferring of the waste-heat between the cooling component and the heat spreader via the heat transfer device and the receptacle.

* * * * *